(12) United States Patent
Sargent et al.

(10) Patent No.: US 9,231,223 B2
(45) Date of Patent: *Jan. 5, 2016

(54) THREE-DIMENSIONAL BICONTINUOUS HETEROSTRUCTURES, METHOD OF MAKING, AND THEIR APPLICATION IN QUANTUM DOT-POLYMER NANOCOMPOSITE PHOTODETECTORS AND PHOTOVOLTAICS

(71) Applicant: InVisage Technologies, Inc., Menlo Park, CA (US)

(72) Inventors: Edward Sargent, Toronto (CA); Steven Ashworth McDonald, Binbrook (CA); Shiguo Zhang, Camas, WA (US); Larissa Levina, Toronto (CA); Gerasimos Konstantatos, Barcelona (ES); Paul Cyr, Vancouver (CA)

(73) Assignee: InVisage Technologies, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/887,895

(22) Filed: May 6, 2013

(65) Prior Publication Data

US 2013/0244366 A1 Sep. 19, 2013

Related U.S. Application Data

(63) Continuation of application No. 13/368,747, filed on Feb. 8, 2012, now Pat. No. 8,450,138, which is a continuation of application No. 11/327,655, filed on Jan. 9, 2006, now Pat. No. 8,115,232.

(60) Provisional application No. 60/641,766, filed on Jan. 7, 2005.

(51) Int. Cl.
*H01L 21/00* (2006.01)
*H01L 31/00* (2006.01)
(Continued)

(52) U.S. Cl.
CPC ............. *H01L 51/4213* (2013.01); *B82Y 10/00* (2013.01); *H01L 31/0352* (2013.01);
(Continued)

(58) Field of Classification Search
CPC .............. H01L 51/0545; H01L 51/426; H01L 51/4253; H01L 51/4213; H01L 31/0352
USPC ....................... 257/441, 465, 466; 438/82, 962
See application file for complete search history.

(56) References Cited

U.S. PATENT DOCUMENTS

| 3,962,141 A | 6/1976 | Inoue et al. |
| 3,968,360 A | 7/1976 | Monnier |

(Continued)

FOREIGN PATENT DOCUMENTS

| CN | 1623117 A | 6/2005 |
| EP | 1929531 B1 | 3/2012 |

(Continued)

OTHER PUBLICATIONS

Photoconductivity Conference, Atlantic City, NJ, Wiley, Program Contents, (Nov. 4-6, 1954).

(Continued)

*Primary Examiner* — Nicholas Tobergte
(74) *Attorney, Agent, or Firm* — Schwegman Lundberg & Woessner, P.A.

(57) ABSTRACT

The present invention provides of a three-dimensional bicontinuous heterostructure, a method of producing same, and the application of this structure towards the realization of photodetecting and photovoltaic devices working in the visible and the near-infrared. The three-dimensional bicontinuous heterostructure includes two interpenetrating layers which are spatially continuous, they are include only protrusions or peninsulas, and no islands. The method of producing the three-dimensional biocontinuous heterostructure relies on forming an essentially planar continuous bottom layer of a first material; forming a layer of this first material on top of the bottom layer which is textured to produce protrusions for subsequent interpenetration with a second material, coating this second material onto this structure; and forming a final coating with the second material that ensures that only the second material is contacted by subsequent layer. One of the materials includes visible and/or infrared-absorbing semiconducting quantum dot nanoparticles, and one of materials is a hole conductor and the other is an electron conductor.

1 Claim, 7 Drawing Sheets

(51) Int. Cl.
  *H01L 51/42*      (2006.01)
  *B82Y 10/00*      (2011.01)
  *H01L 31/0352*    (2006.01)
  *H01L 51/05*      (2006.01)
  *H01L 27/30*      (2006.01)
  *H01L 51/00*      (2006.01)
  *H01L 21/02*      (2006.01)
  *B82Y 40/00*      (2011.01)

(52) U.S. Cl.
  CPC ......... *H01L51/0545* (2013.01); *H01L 51/426* (2013.01); *H01L 51/4253* (2013.01); *B82Y 40/00* (2013.01); *H01L 21/0256* (2013.01); *H01L 21/02543* (2013.01); *H01L 21/02568* (2013.01); *H01L 21/02601* (2013.01); *H01L 27/305* (2013.01); *H01L 51/0038* (2013.01); *H01L 51/0566* (2013.01); *Y02E 10/549* (2013.01); *Y10S 977/773* (2013.01); *Y10S 977/774* (2013.01); *Y10S 977/783* (2013.01); *Y10S 977/784* (2013.01); *Y10S 977/954* (2013.01)

(56) References Cited

U.S. PATENT DOCUMENTS

| | | |
|---|---|---|
| 4,002,902 A | 1/1977 | Donjon et al. |
| 4,117,329 A | 9/1978 | Kruer et al. |
| 4,183,748 A | 1/1980 | Murai et al. |
| 4,888,521 A | 12/1989 | Tanioka et al. |
| 4,948,741 A | 8/1990 | Hammond et al. |
| 4,952,839 A | 8/1990 | Tanioka et al. |
| 5,014,069 A | 5/1991 | Seiler et al. |
| 5,124,545 A | 6/1992 | Takanashi et al. |
| 5,130,826 A | 7/1992 | Takanashi et al. |
| 5,233,265 A | 8/1993 | Takasaki et al. |
| 5,260,957 A | 11/1993 | Hakimi et al. |
| 5,262,357 A | 11/1993 | Alivisatos et al. |
| 5,294,992 A | 3/1994 | Konno et al. |
| 5,299,042 A | 3/1994 | Takanashi et al. |
| 5,350,915 A | 9/1994 | Ishihara et al. |
| RE34,947 E | 5/1995 | Takanashi et al. |
| 5,438,198 A | 8/1995 | Ebitani et al. |
| 5,500,188 A | 3/1996 | Hafeman et al. |
| 5,505,928 A | 4/1996 | Alivisatos et al. |
| 5,537,000 A | 7/1996 | Alivisatos et al. |
| 5,591,962 A | 1/1997 | Koishi et al. |
| 5,614,708 A | 3/1997 | Koishi et al. |
| 5,703,436 A | 12/1997 | Forrest et al. |
| 5,751,018 A | 5/1998 | Alivisatos et al. |
| 5,818,053 A | 10/1998 | Tran |
| 5,834,893 A | 11/1998 | Bulovic et al. |
| 5,844,253 A | 12/1998 | Kim et al. |
| 5,923,028 A | 7/1999 | Turnbull et al. |
| 5,923,953 A | 7/1999 | Goldenberg Barany et al. |
| 5,929,689 A | 7/1999 | Wall |
| 5,953,587 A | 9/1999 | Forrest et al. |
| 5,986,268 A | 11/1999 | Forrest et al. |
| 5,990,479 A | 11/1999 | Weiss et al. |
| 5,998,803 A | 12/1999 | Forrest et al. |
| 6,005,252 A | 12/1999 | Forrest et al. |
| 6,046,543 A | 4/2000 | Bulovic et al. |
| 6,064,054 A | 5/2000 | Waczynski et al. |
| 6,107,630 A | 8/2000 | Mazurowski et al. |
| 6,111,902 A | 8/2000 | Kozlov et al. |
| 6,160,828 A | 12/2000 | Kozlov et al. |
| 6,198,091 B1 | 3/2001 | Forrest et al. |
| 6,198,092 B1 | 3/2001 | Bulovic et al. |
| 6,207,229 B1 | 3/2001 | Bawendi et al. |
| 6,207,392 B1 | 3/2001 | Weiss et al. |
| 6,210,814 B1 | 4/2001 | Thompson et al. |
| 6,214,631 B1 | 4/2001 | Burrows et al. |
| 6,225,198 B1 | 5/2001 | Alivisatos et al. |
| 6,239,449 B1 | 5/2001 | Fafard et al. |
| 6,251,303 B1 | 6/2001 | Bawendi et al. |
| 6,264,805 B1 | 7/2001 | Forrest et al. |
| 6,278,055 B1 | 8/2001 | Bulovic et al. |
| 6,287,712 B1 | 9/2001 | Bulovic et al. |
| 6,294,794 B1 | 9/2001 | Yoshimura et al. |
| 6,297,495 B1 | 10/2001 | Bulovic et al. |
| 6,297,516 B1 | 10/2001 | Forrest et al. |
| 6,306,610 B1 | 10/2001 | Bawendi et al. |
| 6,306,736 B1 | 10/2001 | Alivisatos et al. |
| 6,312,836 B1 | 11/2001 | Bulovic et al. |
| 6,319,426 B1 | 11/2001 | Bawendi et al. |
| 6,322,901 B1 | 11/2001 | Bawendi et al. |
| 6,326,144 B1 | 12/2001 | Bawendi et al. |
| 6,333,458 B1 | 12/2001 | Forrest et al. |
| 6,342,325 B1 | 1/2002 | Suda et al. |
| 6,352,777 B1 | 3/2002 | Bulovic et al. |
| 6,396,860 B1 | 5/2002 | Kozlov et al. |
| 6,403,392 B1 | 6/2002 | Burrows et al. |
| 6,407,408 B1 | 6/2002 | Zhou et al. |
| 6,423,551 B1 | 7/2002 | Weiss et al. |
| 6,423,980 B1 | 7/2002 | Bandara et al. |
| 6,426,513 B1 | 7/2002 | Bawendi et al. |
| 6,440,213 B1 | 8/2002 | Alivisatos et al. |
| 6,440,769 B2 | 8/2002 | Peumans et al. |
| 6,444,143 B2 | 9/2002 | Bawendi et al. |
| 6,451,415 B1 | 9/2002 | Forrest et al. |
| 6,458,426 B1 | 10/2002 | Bulovic et al. |
| 6,487,112 B1 | 11/2002 | Wasshuber |
| 6,501,091 B1 | 12/2002 | Bawendi et al. |
| 6,509,066 B1 | 1/2003 | Jost |
| 6,538,801 B2 | 3/2003 | Jacobson et al. |
| 6,548,316 B1 | 4/2003 | Tam et al. |
| 6,548,956 B2 | 4/2003 | Forrest et al. |
| 6,559,468 B1 * | 5/2003 | Kuekes et al. ............... 257/14 |
| 6,576,291 B2 | 6/2003 | Bawendi et al. |
| 6,596,134 B2 | 7/2003 | Forrest et al. |
| 6,602,671 B1 | 8/2003 | Bawendi et al. |
| 6,605,806 B2 | 8/2003 | Walmsley et al. |
| 6,607,829 B1 | 8/2003 | Bawendi et al. |
| 6,617,583 B1 | 9/2003 | Bawendi et al. |
| 6,670,544 B2 | 12/2003 | Kibbel et al. |
| 6,690,012 B1 | 2/2004 | Jacksen et al. |
| 6,692,820 B2 | 2/2004 | Forrest et al. |
| 6,696,299 B1 | 2/2004 | Empedocles et al. |
| 6,699,723 B1 | 3/2004 | Weiss et al. |
| 6,710,366 B1 | 3/2004 | Lee et al. |
| 6,727,065 B2 | 4/2004 | Weiss et al. |
| 6,730,914 B2 | 5/2004 | Chao et al. |
| 6,743,516 B2 | 6/2004 | Murphy et al. |
| 6,774,361 B2 | 8/2004 | Bawendi et al. |
| 6,781,868 B2 | 8/2004 | Bulovic et al. |
| 6,791,130 B2 | 9/2004 | Chao et al. |
| 6,798,033 B2 | 9/2004 | Chao et al. |
| 6,803,719 B1 | 10/2004 | Miller et al. |
| 6,809,358 B2 | 10/2004 | Hsieh et al. |
| 6,809,955 B2 | 10/2004 | Bulovic et al. |
| 6,819,692 B2 | 11/2004 | Klimov et al. |
| 6,821,337 B2 | 11/2004 | Bawendi et al. |
| 6,844,025 B2 | 1/2005 | Forrest et al. |
| 6,844,608 B2 | 1/2005 | Bulovic et al. |
| 6,853,013 B2 | 2/2005 | Hirai et al. |
| 6,855,202 B2 | 2/2005 | Alivisatos et al. |
| 6,855,551 B2 | 2/2005 | Bawendi et al. |
| 6,861,155 B2 | 3/2005 | Bawendi et al. |
| 6,864,626 B1 | 3/2005 | Weiss et al. |
| 6,878,871 B2 * | 4/2005 | Scher et al. ............... 136/252 |
| 6,884,478 B2 | 4/2005 | Alivisatos et al. |
| 6,890,777 B2 | 5/2005 | Bawendi et al. |
| 6,900,458 B2 | 5/2005 | Tung et al. |
| 6,914,265 B2 | 7/2005 | Bawendi et al. |
| 6,917,055 B2 | 7/2005 | Stegmuller |
| 6,918,946 B2 | 7/2005 | Korgel et al. |
| 6,921,496 B2 | 7/2005 | Anderson et al. |
| 6,927,069 B2 | 8/2005 | Weiss et al. |
| 6,939,604 B1 | 9/2005 | Guyot-Sionnest et al. |
| 6,984,369 B1 | 1/2006 | Alivisatos et al. |
| 7,012,363 B2 | 3/2006 | Weaver et al. |
| 7,026,041 B2 | 4/2006 | Forrest et al. |
| 7,042,003 B2 | 5/2006 | Jang et al. |

(56) References Cited

U.S. PATENT DOCUMENTS

| | | | |
|---|---|---|---|
| 7,045,956 B2 | 5/2006 | Braune et al. |
| 7,049,148 B2 | 5/2006 | Bawendi et al. |
| 7,060,243 B2 | 6/2006 | Bawendi et al. |
| 7,132,787 B2 | 11/2006 | Ozkan et al. |
| 7,194,173 B2 | 3/2007 | Shtein et al. |
| 7,419,846 B2 | 9/2008 | Shtein et al. |
| 7,435,617 B2 | 10/2008 | Shtein et al. |
| 7,531,120 B2 | 5/2009 | Van Rijn et al. |
| 7,597,927 B2 | 10/2009 | Peumans et al. |
| 7,742,322 B2 | 6/2010 | Sargent et al. |
| 7,746,681 B2 | 6/2010 | Sargent et al. |
| 7,763,794 B2 | 7/2010 | Hantschel et al. |
| 7,773,404 B2 | 8/2010 | Sargent et al. |
| 7,833,569 B2 * | 11/2010 | Chae et al. ............... 427/66 |
| 7,881,091 B2 | 2/2011 | Sargent et al. |
| 8,023,306 B2 | 9/2011 | Sargent et al. |
| 3,054,671 A1 | 11/2011 | Sargent et al. |
| 8,102,693 B2 | 1/2012 | Sargent et al. |
| 8,115,232 B2 | 2/2012 | Sargent et al. |
| 8,213,212 B2 | 7/2012 | Sargent et al. |
| 8,284,586 B2 | 10/2012 | Sargent et al. |
| 8,284,587 B2 | 10/2012 | Sargent et al. |
| 8,422,266 B2 | 4/2013 | Sargent et al. |
| 8,450,138 B2 * | 5/2013 | Sargent et al. ............... 438/82 |
| 2001/0000005 A1 | 3/2001 | Forrest et al. |
| 2001/0011551 A1 | 8/2001 | Peumans et al. |
| 2001/0023078 A1 | 9/2001 | Bawendi et al. |
| 2001/0040232 A1 | 11/2001 | Bawendi et al. |
| 2001/0046244 A1 | 11/2001 | Klimov et al. |
| 2002/0071952 A1 | 6/2002 | Bawendi et al. |
| 2002/0072234 A1 | 6/2002 | Weiss et al. |
| 2002/0110180 A1 | 8/2002 | Barney et al. |
| 2002/0119297 A1 | 8/2002 | Forrest et al. |
| 2002/0153243 A1 | 10/2002 | Forrest et al. |
| 2002/0160412 A1 | 10/2002 | Bawendi et al. |
| 2002/0163057 A1 | 11/2002 | Bulovic et al. |
| 2002/0163829 A1 | 11/2002 | Bulovic et al. |
| 2002/0163830 A1 | 11/2002 | Bulovic et al. |
| 2002/0172820 A1 * | 11/2002 | Majumdar et al. ............ 428/357 |
| 2002/0175326 A1 * | 11/2002 | Reed et al. ............... 257/40 |
| 2002/0182632 A1 | 12/2002 | Anderson et al. |
| 2002/0197462 A1 | 12/2002 | Forrest et al. |
| 2003/0003300 A1 | 1/2003 | Korgel et al. |
| 2003/0099968 A1 | 5/2003 | Weiss et al. |
| 2003/0100130 A1 | 5/2003 | Weiss et al. |
| 2003/0113709 A1 | 6/2003 | Alivisatos et al. |
| 2003/0127659 A1 | 7/2003 | Bawendi et al. |
| 2003/0127660 A1 | 7/2003 | Bawendi et al. |
| 2003/0127973 A1 | 7/2003 | Weaver et al. |
| 2003/0136943 A1 | 7/2003 | Alivisatos et al. |
| 2003/0142944 A1 | 7/2003 | Sundar et al. |
| 2003/0145779 A1 | 8/2003 | Alivisatos et al. |
| 2003/0209105 A1 | 11/2003 | Bawendi et al. |
| 2003/0213967 A1 | 11/2003 | Forrest et al. |
| 2003/0226498 A1 | 12/2003 | Alivisatos et al. |
| 2004/0004982 A1 | 1/2004 | Eisler et al. |
| 2004/0017834 A1 | 1/2004 | Sundar et al. |
| 2004/0023010 A1 | 2/2004 | Bulovic et al. |
| 2004/0031965 A1 | 2/2004 | Forrest et al. |
| 2004/0031966 A1 | 2/2004 | Forrest et al. |
| 2004/0033359 A1 | 2/2004 | Bawendi et al. |
| 2004/0038310 A1 | 2/2004 | Bawendi et al. |
| 2004/0091710 A1 | 5/2004 | Bawendi et al. |
| 2004/0094757 A1 | 5/2004 | Braune et al. |
| 2004/0099307 A1 | 5/2004 | Sun |
| 2004/0110002 A1 | 6/2004 | Kim et al. |
| 2004/0115817 A1 | 6/2004 | Liu et al. |
| 2004/0118448 A1 | 6/2004 | Scher et al. |
| 2004/0126072 A1 | 7/2004 | Hoon Lee et al. |
| 2004/0146560 A1 | 7/2004 | Whiteford et al. |
| 2004/0151887 A1 | 8/2004 | Forrest et al. |
| 2004/0164292 A1 | 8/2004 | Tung et al. |
| 2004/0191915 A1 | 9/2004 | Bawendi et al. |
| 2004/0217298 A1 | 11/2004 | Bawendi et al. |
| 2004/0259363 A1 | 12/2004 | Bawendi et al. |
| 2005/0002635 A1 | 1/2005 | Banin et al. |
| 2005/0017176 A1 | 1/2005 | Koch et al. |
| 2005/0020922 A1 | 1/2005 | Frangioni et al. |
| 2005/0020923 A1 | 1/2005 | Frangioni et al. |
| 2005/0031888 A1 | 2/2005 | Bawendi et al. |
| 2005/0048283 A1 | 3/2005 | Bawendi et al. |
| 2005/0054004 A1 | 3/2005 | Alivisatos et al. |
| 2005/0061363 A1 | 3/2005 | Ginley et al. |
| 2005/0072989 A1 | 4/2005 | Bawendi et al. |
| 2005/0079659 A1 | 4/2005 | Duan et al. |
| 2005/0084443 A1 | 4/2005 | Bawendi et al. |
| 2005/0088380 A1 | 4/2005 | Bulovic et al. |
| 2005/0109269 A1 | 5/2005 | Alivisatos et al. |
| 2005/0112849 A1 | 5/2005 | Stott et al. |
| 2005/0116256 A1 | 6/2005 | Bulovic et al. |
| 2005/0118631 A1 | 6/2005 | Bawendi et al. |
| 2005/0120946 A1 | 6/2005 | Hines et al. |
| 2005/0133087 A1 | 6/2005 | Alivisatos et al. |
| 2005/0136232 A1 | 6/2005 | Forrest et al. |
| 2005/0146258 A1 | 7/2005 | Weiss et al. |
| 2005/0196894 A1 | 9/2005 | Maa et al. |
| 2005/0202615 A1 | 9/2005 | Duan et al. |
| 2005/0205879 A1 | 9/2005 | Fukunaga |
| 2005/0211154 A1 | 9/2005 | Alivisatos et al. |
| 2005/0224531 A1 | 10/2005 | Bulovic |
| 2005/0227373 A1 | 10/2005 | Flandre et al. |
| 2005/0230673 A1 | 10/2005 | Mueller et al. |
| 2005/0251027 A1 | 11/2005 | Liu et al. |
| 2005/0258418 A1 | 11/2005 | Steckel et al. |
| 2005/0287717 A1 | 12/2005 | Heald et al. |
| 2006/0003464 A1 | 1/2006 | Weiss et al. |
| 2006/0013549 A1 | 1/2006 | Shtein et al. |
| 2006/0019098 A1 | 1/2006 | Chan et al. |
| 2006/0057637 A1 | 3/2006 | Anderson et al. |
| 2006/0060862 A1 | 3/2006 | Bawendi et al. |
| 2006/0068154 A1 | 3/2006 | Parce et al. |
| 2006/0070653 A1 | 4/2006 | Elrod et al. |
| 2006/0073607 A1 | 4/2006 | Rose et al. |
| 2006/0076036 A1 | 4/2006 | Whitefield et al. |
| 2006/0097247 A1 | 5/2006 | Kim et al. |
| 2006/0114960 A1 | 6/2006 | Snee et al. |
| 2006/0115585 A1 | 6/2006 | Bulovic et al. |
| 2006/0157720 A1 | 7/2006 | Bawendi et al. |
| 2006/0159901 A1 | 7/2006 | Tischler et al. |
| 2006/0170331 A1 | 8/2006 | Bertram et al. |
| 2006/0176485 A1 | 8/2006 | Bulovic et al. |
| 2006/0177945 A1 | 8/2006 | Weiss et al. |
| 2006/0181629 A1 | 8/2006 | Miyashita et al. |
| 2006/0182970 A1 | 8/2006 | Bawendi et al. |
| 2006/0243959 A1 | 11/2006 | Sargent et al. |
| 2007/0132052 A1 | 6/2007 | Sargent et al. |
| 2007/0157178 A1 | 7/2007 | Kogan et al. |
| 2007/0174939 A1 | 7/2007 | Sargent et al. |
| 2009/0038677 A1 | 2/2009 | Su et al. |
| 2009/0266418 A1 | 10/2009 | Hu et al. |
| 2009/0305452 A1 | 12/2009 | Sargent et al. |
| 2010/0133418 A1 | 6/2010 | Sargent et al. |
| 2010/0314529 A1 | 12/2010 | Sargent et al. |
| 2010/0314603 A1 | 12/2010 | Sargent et al. |
| 2010/0317175 A1 | 12/2010 | Sargent et al. |
| 2011/0315959 A1 | 12/2011 | Sargent et al. |
| 2012/0100699 A1 | 4/2012 | Sargent et al. |
| 2012/0145884 A1 | 6/2012 | Sargent |
| 2012/0208315 A1 | 8/2012 | Sargent et al. |
| 2013/0009129 A1 | 1/2013 | Sargent et al. |
| 2013/0228749 A1 | 9/2013 | Sargent et al. |

FOREIGN PATENT DOCUMENTS

| | | |
|---|---|---|
| KR | 1020040091898 | 11/2004 |
| TW | 200934991 A | 9/2009 |

(56) References Cited

FOREIGN PATENT DOCUMENTS

| WO | WO-9315525 A1 | 8/1993 |
|---|---|---|
| WO | WO-03085448 A1 | 10/2003 |
| WO | WO-2005101530 A1 | 10/2005 |
| WO | WO-2006072181 A1 | 7/2006 |
| WO | WO-2007102051 A2 | 9/2007 |

OTHER PUBLICATIONS

"U.S. Appl. No. 11/327,655, Advisory Action mailed Apr. 27, 2011", 3 pgs.

"U.S. Appl. No. 11/327,655, Final Office Action mailed Jan. 14, 2011", 9 pgs.

"U.S. Appl. No. 11/327,655, Final Office Action mailed May 13, 2009", 14 pgs.

"U.S. Appl. No. 11/327,655, Non Final Office Action mailed Feb. 3, 2010", 14 pgs.

"U.S. Appl. No. 11/327,655, Non Final Office Action mailed Jul. 23, 2008", 14 pgs.

"U.S. Appl. No. 11/327,655, Notice of Allowance mailed Nov. 25, 2011", 5 pgs.

"U.S. Appl. No. 11/327,655, Response filed Jan. 23, 2009 to Non Final Office Action mailed Jul. 23, 2008", 15 pgs.

"U.S. Appl. No. 11/327,655, Response filed Mar. 12, 2008 to Restriction Requirement mailed Sep. 18, 2007", 12 pgs.

"U.S. Appl. No. 11/327,655, Response filed Apr. 6, 2011 to Final Office Action mailed Jan. 14, 2011", 10 pgs.

"U.S. Appl. No. 11/327,655, Response filed Aug. 3, 2010 to Non Final Office Action mailed Feb. 3, 2010", 18 pgs.

"U.S. Appl. No. 11/327,655, Response filed Nov. 13, 2009 to Final Office Action mailed May 13, 2009", 15 pgs.

"U.S. Appl. No. 11/327,655, Restriction Requirement mailed Sep. 18, 2007", 8 pgs.

"U.S. Appl. No. 13/368,747, Non Final Office Action mailed Jan. 18, 2013", 6 pgs.

"U.S. Appl. No. 13/368,747, Notice of Allowance mailed Mar. 20, 2013", 8 pgs.

"U.S. Appl. No. 13/368,747, Response filed Feb. 22, 2013 to Non Final Office Action mailed Jan. 18, 2013", 9 pgs.

"Handbook of Conducting Polymers", Skotheim, ed., Dekker, New York, (1986).

"Handbook of Organic-Inorganic Hybrid Materials and Nanocomposites", Nalva, ed., American Scientific Publishers, (2003).

"International Application Serial No. PCT/CA2005/000594, International Search Report mailed Sep. 6, 2005", 4 pgs.

"International Application Serial No. PCT/IB2006/004160, International Search Report mailed Aug. 24, 2006", 5 pgs.

"International Application Serial No. PCT/IB2006/004160, International Search Report mailed Oct. 2, 2007", 5 pgs.

"International Application Serial No. PCT/IB2006/004160, International Search Report mailed Oct. 20, 2007", 4 pgs.

"International Application Serial No. PCT/IB2006/004160, Written Opinion mailed Oct. 20, 2007", 5 pgs.

Bakueva, et al., "Luminescence and Photovoltaic Effects in Polymer-Based Nanocomposites", Handbook of Organic-Inorganic Hybrid Materials and Nanocomposites, vol. 2, Ch. 5, (2003), 181-215.

Bakueva, L., et al., "Size-Tunable Infrared (1000-1600nm) Electroluminescence from PbS Quantum-Dot Nanocrystals in a Semiconducting Polymer", Applied Physics Letters, vol. 82, (2003), 2895-2897.

Brabec, et al., "A Low-Bandgap Semiconducting Polymer for Photovoltaic Devices and Infrared Diodes", Adv. Funct. Mater., 12, (2002), 709-712.

Brabec, et al., "Origin of the Open Circuit Voltage of Plastic Solar Cells", Adv. Funct. Mater., 11, (2001), 374-380.

Breeze, et al., "The Effects of Processing Conditions on Polymer Photovoltaic Device Performace", Proceedings of SPIE, Kafafi, et. al., eds.,, (2004), 5215:271.

Chang, Tung-Wah Frederick, et al., "Efficient excitation transfer from polymer to nanocrystals", Applied Physics Letters, AIP, American Institute of Physics, Melville, NY, US, vol. 84, No. 21, XP012061587, ISSN: 0003-6951, (May 24, 2004), 4295-4297.

Coe, Seth, et al., "Electroluminescence from single monolayers of nanocrystals in molecular organic devices", Nature, (2002), 800-803.

Comparelli, R., et al., "Improved optical properties of CdS quantum dots by ligand exchange", Materials Science and Engineering C, vol. 23, XP002451931, (Dec. 15, 2003), 1083-1086.

Dabbousi, et al., "Electroluminescence from CdSe Quantum-Dot/Polymer Composites", Appl. Phys. Lett., 66, (1995), 1316-1318.

Drees, et al., "Enhanced Photovoltaic Efficiency in Polymer-Fullerene Composites by Thermally Controlled Interfiffusion", Proceedings of SPIE, Kafafi, et al., eds. 5215, (2004), 89.

Drndic, et al., "Transport Properties of Annealed CdSe Collodial Nanocrystal Solids", Appl. Phys., 92, (2002), 7498.

Ettenberg, M., "A little night vision", Advanced Imaging, vol. 20, (2005), 29-32.

Forrest, "The Path to Ubiquitos and Low-Cost Organic Electronic Appliances on Plastic", Nature, 428, (2004), 911-918.

Gadisa, et al., "Correlation Between Oxidation Potential and Open-Circuit Voltage of Composite Solar Cells Based on Blends of Polythiophenes/Fullerene Derivative", Appl. Phys. Lett., 84, (2004), 1609.

Ginger, et al., "Charge Injection and Transport in Films of CdSe Nanocrystals", J. Appl. Phys., 87, (2000), 1361-1368.

Greczynski, et al., "Energy Level Alignment in Organic-Based Three-Layer Structures Studied by Photoelectron Spectroscopy", J. Appl. Phys., 88, (2000), 7187-7191.

Greenham, et al., "Charge Separation and Transport in Conjugated-Polymer/Semiconductor-Nanocrystal Composites Studied by Photoluminescence Quenching and Photoconductivity", Phys. Rev., B 54, (1996), 17628-17637.

Greenwald, et al., "Polymer-Polymer Rectifying Heterojunction Based on Poly (3,4-dicyanothiophene) and MEH-PPV", J. Polym. Sci. A: Polym. Chem., 36, (1998), 3115-3120.

Henckens, et al., "Poly(thienulene vinylene) Derivatives as Low Band Gap Polymers for Photovoltaic Applications", Thin Sol. Films, 572, (2004), 451-2.

Hines, et al., "Colloidal PbS Nanocrystals with Size-Tunable Near-Infrared Emission: Observation of Post-Synthesis Self-Narrowing of the Particle Size Distribution", Advanced Materials, vol. 15, (Nov. 2003), 1844-1849.

Huynh, et al., "CdSe Nanocrystal Rods/Poly (3-hexylthiophene) Composite Photovoltaic Devices", Adv. Mater., 11(11), (1999), 923-927.

Huynh, et al., "Controlling the Morphology of Nanocrystal-Polymer Composites for Solar Cells", Adv. Funct. Mater. 13, (2003), 73-79.

Huynh, et al., "Hybrid Nanorod-Polymer Solar Cells", Science 295, (2002), 2425-2427.

Jin, et al., "Synthesis and Characterization of Highly Luminescent Asymmetric Poly(p-phenylene vinylene) Derivatives for Light-Emitting Diodes", Chem. Mater., 14, (2002), 643-650.

Kim, S., et al., "Near-infrared fluorescent type II quantum dots for sentinel lymph node mapping", Nature Biotechnology, vol. 22, (2004), 93-97.

Kippelen, et al., "Organic Photovoltaics Based on Self-Assembled Mesophases", NCPV and Solar Program Review Meeting, NREL/CD-520-33586, (2003), 431.

Klem, Ethan, et al., "PbS quantum dot electroabsorption modulation across the extended communications band 1200-1700 nm", Applied Physics Letter, AIP, American Institute of Physics, Melville, NY, US, vol. 87, No. 5, XP012077333, ISSN: 0003-6951, (Jul. 25, 2005), 53101-53101.

Klimov, "Charge Carrier Dynamics and Optical Gain in Nanocrystal Quantum Dots: From Fundamental Photophysics to Quantum-Dot Lasing", Chapter 5 of Semiconductor and Metal Nanocrystals: Synthesis and Electronic and Optical Properties, (2004), 159-214.

Koetse, et al., "The Influence of the Polymer Architecture on Morphology and Device Properties of Polymer Bulk Heterojunction Photovoltaic Cells", Proceedings of SPIE, Kafafi, et al., eds., 5215, (2004), 119.

(56) References Cited

OTHER PUBLICATIONS

Konstantatos, G., et al., "Ultrasensitive solution-case quantum dot photodetectors", Nature, vol. 442, (2006), 180-183.

Lee, et al., "Luminescent Spectral Changes in Polymer Light-Emitting Diodes after Heat Treatments", Molec. Cryst. and Liq. Cryst. 349, (2000), 451-454.

Lim, Y., et al., "Selection of quantum dot wavelengths for biomedical assays and imaging", Molecular Imaging, vol. 2, (2003), 50-64.

Mattoussi, et al., "Electroluminescence from Heterostructures of Poly(phenylene vinylene) and Inorganic CdSe Nanocrystals", J. Appl. Phys., 83, (1998), 7965-7947.

McDonald, S., et al., "Photoconductivity from PbS-nanocrystal/semiconducting polymer composites from solution-processible, quantum-size tunable infrared photodetectors", Applied Physics Letters, AIP, American Institute of Physics, Melville, NY, US, vol. 85, No. 11, XP012062554, ISSN: 0003-6951, (Sep. 15, 2004), 2089-2091.

McDonald, S., et al., "Solution-processed PbS quantum dot infrared photodetectors and photovoltaics", Nature Materials, vol. 4, (2005), 138-142.

Murray, et al., "Synthesis and Characterization of Nearly Monodisperse CdE (E=S, Se, Te) Semiconductor Nanocrystallites", J. Amer. Chem. Soc., 115, (1993), 8706-8715.

Nguyen, et al., "Controlling Interchain Interactions in Conjugated Polymers: The Effects of Chain Morphology on Exciton-Exciton Annihilation and Aggregation in MEH-PPV Filmes", J. Phys. Chem. B, 104, (2000), 237-255.

Nguyen, et al., "Improving the Performance of Conjugated Polymer-Based Devices by Control of Interchain Interactions and Polymer Film Morphology", Appl. Phys. Lett., 76, (2000), 2454-2456.

Peumans, et al., "Small Molecular Weight Organic Thin-Film Photodetectors and Solar Cells", J. Appl. Phys. 93, (2003), 3693-3723.

Rong, H., et al., "A Continuous-Wave Raman Silicon Laser", Nature, 433(7027), (2005), 725-728.

Sargent, E. H., "Infared Quantum Dots", Advanced Materials, vol. 17, 515-522.

Sargent, E. H., "Towards CMOS-compatible, solution-processed quantum dot nanocrystal optical sources, modulators, detectors, and optical signal processing elements across the extended communications band 1200-1700 nm", Group IV Photonics, First IEEE International Conference on Hong Kong, China Sep. 29-Oct. 1, 2004, Piscataway, NJ, USA, IEEE, US, XP010782181, ISBN: 0-7803-8474-1, (Sep. 29, 2004), 52-54.

Schlamp, et al., "Improved Efficiencies in Light Emitting Diodes Made with CdSe(CdS) Core/Shell Type Nanocrystals and Semiconducting Polymer", J. Appl. Phys., 82, (1997), 5837-5842.

Solomeshch, O., et al., "Optoelectronic properties of polymer-nanocrystal composites active at near-infrared wavelengths", Journal of Applied Physics, vol. 98, XP002451932, USA, (2005), 074310-1-074310-6.

Steckel, et al., "1.3um to 1.55um Tunable Electroluminescence from PbSe Quantum Dtos Embedded Within an Organic Device", Adv. Mater, 15, (2003), 1862-1866.

Stok, et al., "Lighting the Local Area: Optical Code-Division Multiple Access and Quality of Service Provisioning", IEEE Network 14, (Nov./Dec. 2000), 42-46.

Takada, Shunji, et al., "CMOS Image Sensor with Organic Photoconductive Layer Having Narrow Absorption Band and Proposal of Stack Type Solid-State Image Sensors", Sensors, Cameras, and Systems for Scientific/Industrial Applications, VII, edited by Morley M. Blouke, Proc. of SPIE—IS&T Electronic Imaging, SPIE vol. 6068, 6068A, (2006), 6068A-1-6068A-8.

Tessler, N., et al., "Efficient near-infrared polymer nanocrystals light-emitting diodes", Science, vol. 295, (2002), 1506-1508.

Wang, et al., "Photoconductivity of CdS Nanocluster-Doped Polymers", Chem. Phys. Lett., 200, (1992), 71-75.

Warner, J. H., et al., "Controlling PbS noncrystal aggregation in conducting polymers", Nanotechnology, No. 16, XP002451930, UK, (2005), 2381-2384.

Wei, et al., "Effect of crystalline microstructure on the photophysical performance of polymer/perylene composite films", Chinese Physics, 12(4), (Apr. 2003), 426-432.

Wessels, J.M., et al., "Optical and electrical properties of three-dimensional interlinked gold nanoparticles assemblies", Journal of the American Chemical Society, vol. 126, (2004), 3349-3356.

Yoshino, et al., "Near IR and UV Enhanced Photoresponse of C60-doped Semiconducting Polymer Photodiode", Adv. Mater. 11, (1999), 1382-1385.

Yu, D., et al., "n-Type Conducting CdSe Nanocrystals Solids", Science, vol. 300, (2003), 1277-1280.

Zhao, X., et al., "Synthesis and optical properties of thiol-stabilised PbS nanocrystals", Langmuir, vol. 21, XP002451929, (2005), 1086-1090.

"U.S. Appl. No. 13/323,387, Preliminary Amendment filed Feb. 28, 2012", 4 pgs.

"U.S. Appl. No. 13/848,449, Non Final Office Action mailed Jul. 10, 2013", 5 pgs.

"U.S. Appl. No. 13/848,449, Notice of Allowance mailed Jan. 28, 2014", 7 pgs.

"U.S. Appl. No. 13/848,449, Response filed Jan. 10, 2014 to Non Final Office Action mailed Jul. 10, 2013", 6 pgs.

"Chinese Application Serial No. 201010622600.3, Voluntary Amendment filed Dec. 6, 2011", English claims, 3 pgs.

"International Application Serial No. PCT/CA2006/000018, International Preliminary Report on Patentability mailed Jul. 10, 2007", 7 pgs.

"International Application Serial No. PCT/CA2006/000018, International Search Report mailed May 19, 2006", 4 pgs.

"International Application Serial No. PCT/CA2006/000018, International Written Opinion mailed May 16, 2006", 6 pgs.

"International Application Serial No. PCT/IB2006/004160, International Preliminary Report on Patentability mailed Feb. 26, 2008", 6 pgs.

"Taiwanese Application Serial No. 095131458, Office Action mailed Apr. 26, 2013", w/English translation, 6 pgs.

"Taiwanese Application Serial No. 095131458, Response filed Oct. 24, 2013 to Office Action mailed Apr. 26, 2013", 41 pgs.

\* cited by examiner

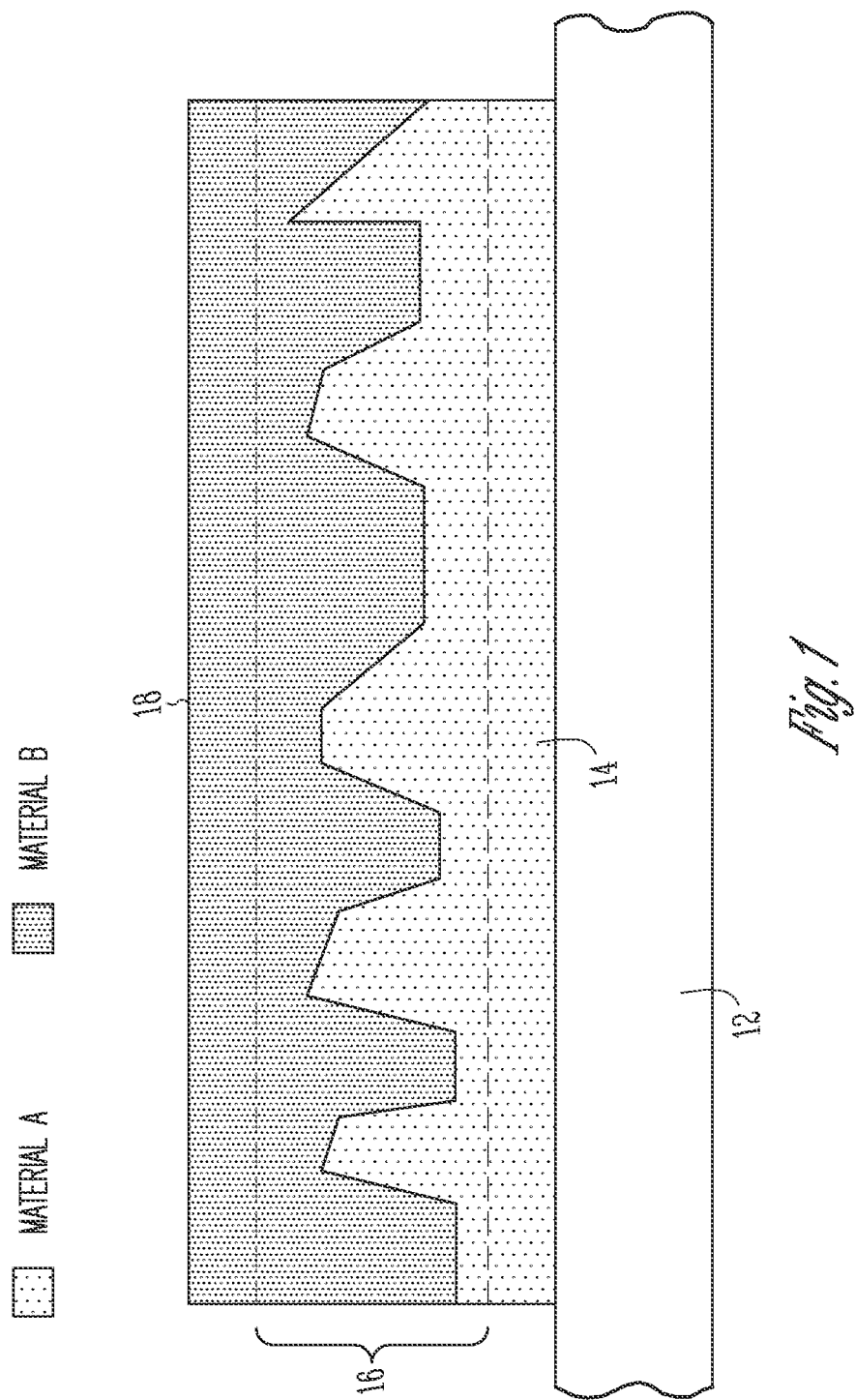

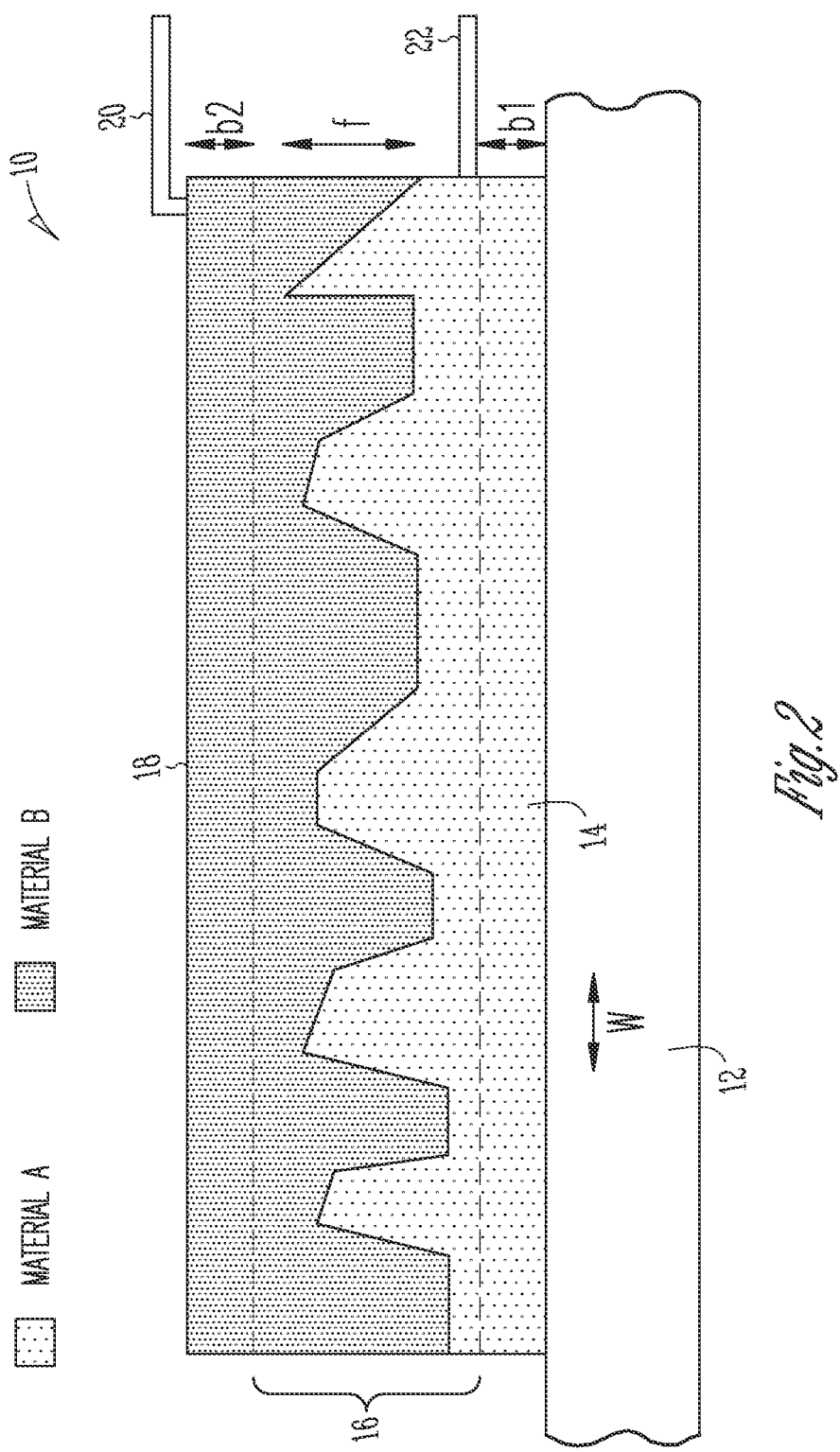

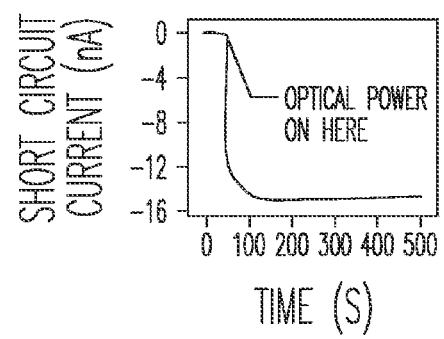
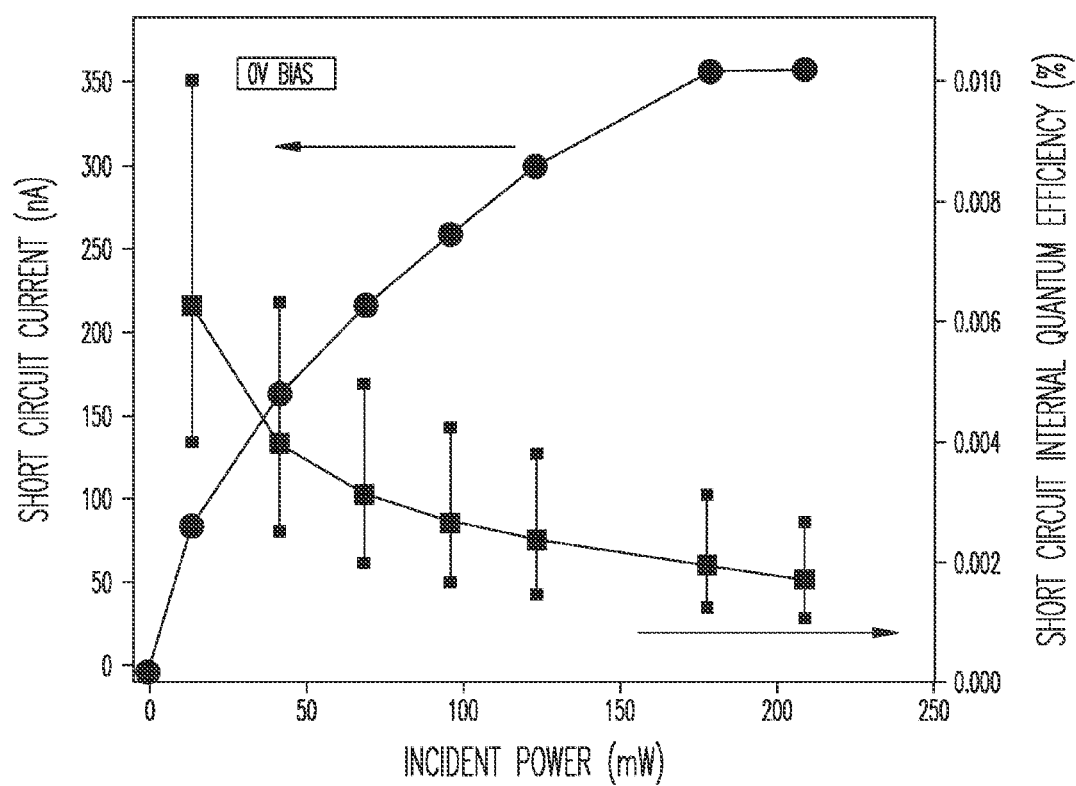
Fig. 4B

THREE-DIMENSIONAL BICONTINUOUS HETEROSTRUCTURES, METHOD OF MAKING, AND THEIR APPLICATION IN QUANTUM DOT-POLYMER NANOCOMPOSITE PHOTODETECTORS AND PHOTOVOLTAICS

CROSS REFERENCE TO RELATED APPLICATION

This patent application is a continuation of U.S. patent application Ser. No. 13/368,747, filed on Feb. 8, 2012, now issued as U.S. Pat. No. 8,450,138, which is a continuation of U.S. patent application Ser. No. 11/327,655, filed on Jan. 9, 2006, now issued as U.S. Pat. No. 8,115,232, which relates to, and claims the priority benefit from, U.S. Provisional Patent Application Ser. No. 60/641,766, filed on Jan. 7, 2005, entitled "QUANTUM DOT—POLYMER NANOCOMPOSITE PHOTODETECTORS AND PHOTOVOLTAICS," all of which are incorporated herein by reference in their entireties.

FIELD OF THE INVENTION

The present invention relates to a three-dimensional bicontinuous heterostructure, a method of producing same, and the application of this structure towards the realization of photodetecting and photovoltaic devices working in the visible and the near-infrared.

BACKGROUND OF THE INVENTION

In contrast to traditional semiconductors, conjugated polymers provide ease of processing, low cost, physical flexibility, and large-area coverage. These active optoelectronic materials produce and harvest light efficiently in the visible spectrum. The same functions are required in the short-wavelength infrared (1-2 um) for telecommunications (1300-1600 nm), nightime and low-light imaging (1000 nm and beyond), biological imaging (800 nm and 1100 nm and 1300 nm transparent tissue windows), thermal photovoltaics (>1900 nm), and solar cells (800-2000 nm). Photodetecting and photovoltaic polymer devices have yet to demonstrate significant sensitivity beyond ~800 nm.

Organic/nanocrystal composites have been demonstrated to enable a number of important optoelectronic devices operating in the visible region. In the infrared, electroluminescence has been demonstrated from such materials. Prior to the results presented herein, there has been no demonstration of a short-wavelength infrared photovoltaic effect from such a material system.

Control of organic-inorganic interfaces on the nanoscale is of critical importance in organic electronics, and in particular in photovoltaic devices based on inorganic quantum dots embedded in a semiconducting polymer matrix. In these systems, rapid and efficient charge separation is needed for subsequent separate transport and extraction of electrons and holes. Organic ligands passivating the surfaces of nanocrystals are needed to enable solution-processing without aggregation, yet these ligands are typically insulating and thus impede charge transfer between the nanocrystal and polymer. Moderate success has been achieved in conjugated polymer/inorganic nanocrystal composite-based solar cells active in the visible region, and these hold the promise for fabrication of large area photovoltaics on flexible substrates using low-cost processing methods such as solution spin coating. However, approximately 50% of solar energy reaching the Earth's surface lies in the visible region, and the remainder in the infrared (IR) region beyond 700 nm. It is therefore of great interest to develop IR sensitive devices, ultimately to enable harvesting of the full solar spectrum.

Infrared photoconductive and photovoltaic devices based on the solution-processible PbS quantum dot/MEH-PPV materials system have recently been reported. These first reports exhibited promising efficiencies meriting further optimization. Many factors can affect photovoltaic device performance, such as the effectiveness of charge separation and the magnitude of charge mobility, as well as the efficiency of charge collection. It is fundamentally important to understand these processes and to increase the effectiveness of these processes in the device in order to optimize performance.

SUMMARY OF THE INVENTION

The present invention consists of a three-dimensional bicontinuous heterostructure, a method of producing same, and the application of this structure towards the realization of photodetecting and photovoltaic devices working in the visible and the near-infrared.

In one aspect of the invention there is provided a nanocomposite layered device, comprising:

a) a three-dimensional bicontinuous heterostructure including at least two materials with a first material formed on a substrate, a second material located on the first material, said first and second materials each having a structure and morphology which includes protrusions and wherein said protrusions from said first material penetrate into said second material and said protrusions from said second material penetrate into said first material to form an interpenetrating interface between said first and second materials, and wherein said protrusions from said first and second materials are spatially continuous;

b) wherein said first material and said second material are selected from the group consisting of polymers, visible and/or infrared-absorbing semiconducting quantum dot nanoparticles, conductive oxides and polymer-visible and/or infrared-absorbing semiconducting quantum dot nanoparticle composites but are not identical materials, and c) wherein upon absorption of light in said first or second material an electron-hole pair is formed which drifts to said interpenetrating interface wherein said electron-hole pair is separated with the hole moving into one of the materials and the electron moving into the other material.

In another aspect of the invention there is provided a nanocomposite layered device, comprising:

A nanocomposite layered device, comprising:

a) a three-dimensional bicontinuous heterostructure including at least two materials with a first material formed on a substrate, a second material located on the first material, said first and second materials each having a structure and morphology which includes protrusions and wherein said protrusions from said first material penetrate into said second material and said protrusions from said second material penetrate into said first material to form an interpenetrating interface between said first and second materials, and wherein said protrusions from said first and second materials are spatially continuous;

b) at least of one of said first and second materials includes visible and/or infrared-absorbing semiconducting quantum dot nanoparticles; and c) wherein upon absorption of light by said visible and/or infrared-absorbing quantum dot nanoparticles, an electron-hole pair is formed which drifts to said interpenetrating interface wherein said the electron-hole pair is separated.

The three-dimensional bicontinuous heterostructure is a composition of matter in which at least two interpenetrating layers are spatially continuous (they are comprised only of peninsulas, and no islands); and in which each layer forms the exclusive plane of contact to one side, one material to a bottom contact, the other material to a top contact.

The method of producing the three-dimensional bicontinuous heterostructure relies on forming an essentially planar continuous bottom layer of a first material; forming a layer of this first material on top of the bottom layer which is textured to produce protrusions for subsequent interpenetration with a second material, coating this second material onto this structure; and forming a final coating with the second material that ensures that only the second material is contacted by subsequent layer.

Thus in one aspect of the present invention there is provided a process for producing a nanocomposite layered device, comprising the steps of:

a) depositing a first material on a surface of a substrate to form a first continuous layer, and treating said first continuous layer to render it non-redispersable in a first solvent;

b) forming a first dispersion by co-dispersing said first material and a second material in said first solvent and depositing said first dispersion on a top surface of said first layer to form a second layer completely covering said first layer of pre-selected thickness in such a way as to obtain phase separation of the first and second materials constituents and treating said second layer to render it non-redispersible in a second solvent;

c) forming a dispersion by dispersing said second material in said second solvent and depositing it on a top surface of said second layer to form a third continuous layer completely covering said second layer;

d) wherein a structure formed in steps a), b) and c) is a three-dimensional bicontinuous heterostructure wherein said first layer is a continuous layer of said first material, said third layer is a continuous layer of said second material and said second layer is an interpenetrating interfacial layer between said first and second materials, formed by protrusions from said first and second materials which are spatially continuous; and e) wherein at least one of said first and second materials includes visible and/or infrared-absorbing semiconducting quantum dot nanoparticles, and wherein at least one of said first and second materials includes an electron conducting constituent and the other material includes a hole conducting constituent.

The nanocomposite layered device may be annealed after being produced.

In another aspect a process for producing a nanocomposite layered device comprises the steps of:

a) depositing a first material on a surface of a substrate to form a first continuous layer, and texturing said first continuous layer treating said first continuous layer to produce a textured first material having protrusions;

b) depositing a second material onto the textured first material having protrusions such that the second material interpenetrates said protrusions and completely covers the protrusions with a second continuous layer so that none of the protrusions of the first material are exposed;

c) wherein a structure formed in steps a) and b) is a three-dimensional bicontinuous heterostructure including first continuous layer of said first material, a third continuous layer of said second material and said second layer is an interpenetrating interfacial layer between said first and second materials, formed by protrusions from said first and second materials which are spatially continuous; and d) wherein at least one of said first and second materials includes visible and/or infrared-absorbing semiconducting quantum dot nanoparticles, and wherein at least one of said first and second materials includes an electron conducting constituent and the other material includes a hole conducting constituent.

These methods are all reliant upon means described herein of ensuring that the deposition of progressive layers, typically using solution-processing, does not result redispersion of the layer or layers lying beneath. This relies on a variety of treatments to the underlying layers that ensure non-redispersion in ensuing layers' solvents used in deposition.

Further features of the invention will be described or will become apparent in the course of the following detailed description.

BRIEF DESCRIPTION OF THE DRAWINGS

The invention will now be described by way of example only, with reference to the accompanying drawings, in which:

FIG. 1 shows a cross section of a three-dimensional bicontinuous heterostructure produced in accordance with the present invention;

FIG. 2 is the same as FIG. 1 but showing the labelled dimensions for thickness, width of the three-dimensional bicontinuous heterostructure;

FIG. 4b shows short circuit current (circles) and corresponding internal quantum efficiency (squares) as a function of incident power, the lines are provided to guide the eye, and the inset shows stability of the short circuit current as a function of time for a sample with much lower photovoltaic response than in FIG. 3b.

DETAILED DESCRIPTION OF THE INVENTION

Figure 3A:
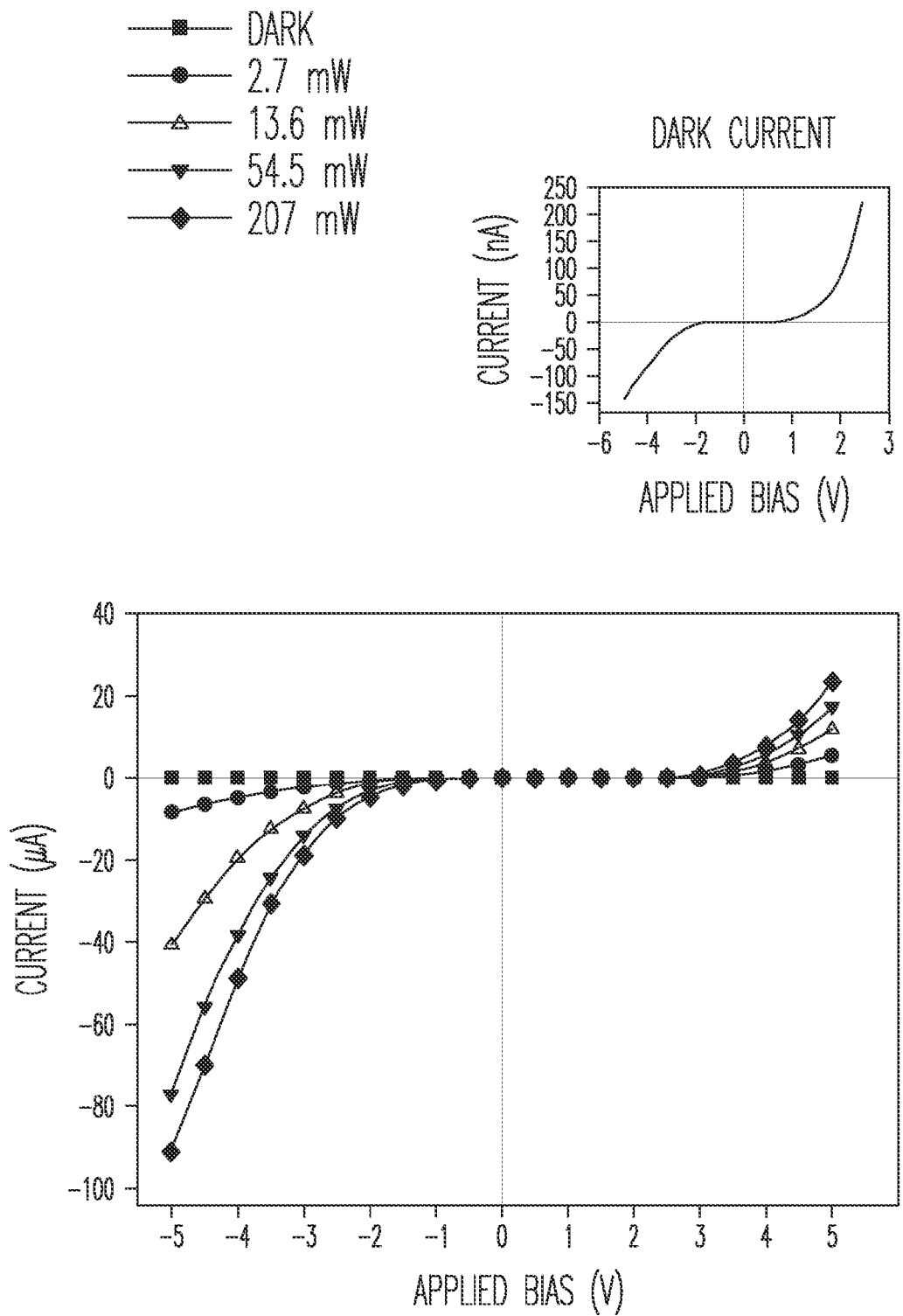
FIG. 3a shows dark current and photocurrent versus applied bias at the ITO electrode for a three-dimensional bicontinuous heterostructure shown in FIG. 1 over a wide potential range from −5V to +5V.

Referring to FIG. 1, a three-dimensional bicontinuous heterostructure 10 produced in accordance with the present invention includes a substrate 12 having a first layer 14 made from constituent material A, a second layer 16 which constituents A and B are codeposited on top of first layer 14 in such a way as to obtain phase separation of the two constituents to form the second layer 16. A third layer 18 comprised of constituent material B alone is deposited onto layer second layer 16. This structure shown in FIG. 1 then comprises lower layer 14 of material A directly on the substrate 12 and the outer layer 18 of material B with the structure being characterized by layers A and B being highly interpenetrating at the interface between then which forms the second layer 16. The two interpenetrating layers are spatially continuous (they consist only of protrusions (peninsulas) and no islands) and in which each layer forms the exclusive plane of contact to one side, one material to a bottom contact, the other material to a top contact.

Referring to FIG. 2, the relative thicknesses of the first layer 14, second layer 16 and third layer 18 are shown. The thickness b1 is referred to as the lower buffer thickness and is the thickness of the layer 14 containing only material A. The thickness b2 is known as the upper buffer thickness and is the thickness of the layer 18 containing only material A. The thickness t is the thickness of the second layer 16 also known as the as the middle layer thickness. The dimension f is known as the average finger (or protrusion) height and is a measure of the interpenetration of constituent materials A and B. The dimension w is known as the average finger width.

Thickness b1 is as thin as possible while still ensuring that the lower buffer is still entirely continuous (pinhole-free), typically from about 2 nm to about 200 nm. The thickness f is as thick as possible while still ensuring that each finger is continuous, preferably in a range from about 200 nm to about 20 um. The thickness t is greater than or equal to, but in any case very similar to, thickness f. The thickness b2 is as thin as possible while still ensuring that the upper buffer is still entirely continuous (pinhole-free), preferably in the range from about 2 to about 200 nm. The dimension w is between about 10 nm and 1000 nm, but preferably in the range from about 50 to about 200 nm.

One method of producing the nanocomposite layered device includes depositing the first material on a surface of a substrate to form a first continuous layer, and treating it to render it non-redispersable in a solvent. A dispersion if formed by co-dispersing the first material and the second material in the solvent and depositing the dispersion on a top surface of the first layer to form a second layer completely covering the first layer with the dispersion being deposited in such a way as to obtain phase separation of the first and second materials. The resulting layer is treated to render it non-redispersible in a solvent used to disperse the second material which is then deposited on the top surface of the second layer to form a third continuous layer completely covering the second layer. This produces a three-dimensional bicontinuous heterostructure wherein the first layer is a continuous layer of the first material, the third layer is a continuous layer of the second material and the second layer is an interpenetrating interfacial layer between said first and second materials, formed by protrusions from the first and second materials which are spatially continuous.

The nanocomposite layered device may be annealed after being produced.

In one process to make the structure of FIGS. 1 and 2, material A is first dispersed in a first solvent and A is first deposited on substrate 12 to form a continuous, planar coating 14, Coating 14 is treated to be non-redispersable in a second solvent. Materials A and B are co-dispersed in the second solvent and then A and B are co-deposited on top of layer 14, forming layer 16. Layer 16 is then treated to render it non-redispersible in a third solvent. Material B is dispersed in this third solvent and material B is deposited on layer 16 to produce layer 18.

The step of rendering layer 16 non-redispersible may be achieved in one of several ways including taking no action in which case the material will no longer disperse following evaporation of its solvent. Another way uses a solution-phase treatment which involves the removal of a moiety, such as the ligands used to cap colloidal quantum dots, which served to provide solubility in that medium's original solvent an that the material will no longer disperse in the solvent. The treatment may involve submerging the structure in a new solvent, or spraying a new solvent on the structure, or spin-coating a new solvent onto the structure. Another way uses a gas-phase treatment which involves exposing the structure to an environment rich in a particular gas, or alternatively lacking any gas (a vacuum environment), and exposing the structure to a particular temperature profile, generally involving a temperature elevated beyond room temperature. The material will no longer disperse due to the removal of a moiety, such as the ligands used to cap colloidal quantum dots, which served to provide solubility in that medium's original solvent.

The solvents may include for example chloroform, tolune, dichlorobenzene, hexanes, pyridine, water, N,N-dimethylformamide, acetone, methanol, isopropanol to mention just a few. The gases may include oxygen, argon, nitrogen, and reducing gas agents such as chlorine. Vacuum may also be used.

Another process to make the structure of FIGS. 1 and 2 includes forming an essentially planar continuous bottom layer of first material A on the substrate surface, forming a layer of first material A on top of the bottom layer which is textured to produce protrusions for subsequent interpenetration with second material B then coating second material B onto this structure and forming a final coating with second material B that ensures that only material B is contacted by subsequent layer.

The nanocomposite layered device may be made by depositing the first material on the surface of the substrate to form a first continuous layer, and then texturing it to produce a textured layer material having protrusions. The second material is then deposited onto the textured first material such that the second material interpenetrates the protrusions and completely covers the protrusions with a second continuous layer so that none of the protrusions of the first material are exposed.

In a variation of this method, the step of depositing the material A on the surface of the substrate includes depositing the material A to form a continuous layer then depositing more of the first material A under conditions suitable to give a textured layered having protrusions. The second material B is deposited to fill in the textured layer having protrusions, and then depositing more of the second material B to give a continuous layer on top of interpenetrating interfacial layer.

The first material A and the second material B may each to be chosen from the list including polymers, nanocrystals or quantum dots, conductive oxides, polymer-nanocrystal composite where the nanocrystals or quantum dots are preferably visible and/or infrared-absorbing semiconducting quantum dot nanoparticle composites. While each of materials A and B can be selected from the same list of materials they are not identical materials.

Those skilled in the art will understand that the nanocomposite layered device may be made with a variety of infrared-absorbing semiconducting quantum dot nanoparticles made of materials including, but not limited to, Ge, SiGe, PbS, CdS, CdSe, PbSe, InAs, InP, InSb and InGaAsP. Core-shell nanoparticles consisting of combinations of these or other semiconductors arrayed in a core-shell geometry may also be used incorporated into one the two materials.

Material A may include a semiconducting polymer underlayer, material B may be a nanocomposite layer containing a semiconducting polymer in combination with the infrared-absorbing quantum dot nanoparticles deposited in such a way that the middle layer 16 is comprised of materials A and B being interpenetrated, not forming a uniform mixture.

Material A in layer 14 may be formed of just the above mentioned semiconductor nanoparticles, initially coated with organic ligands (amines, thiols, fatty acids, phosphines, phosphine oxides). Material A may also include organic molecules, be they oligomeric or polymeric (MEH-PPV, polythiophene including regio-regular polythiophene) which transport electrons and/or holes. Material A may also include conductive oxides including but not limited to indium tin oxide, tin oxide, antimony-doped indium tin oxide and antimony-doped tin oxide.

Material B may be chosen from the same list of materials as used for material A. Specific combinations of material A and B of interest include: material A is an infrared light-absorbing material such as PbS quantum dots, or a blend of PbS quantum dots with another solution-processed material (e.g. MEH-PPV) resulting in material A being a nanocomposite; and Material B is a semiconducting polymer, or a conductive oxide, or another type of quantum dots such as PbSe, CdSe, or MP, or another blend of quantum dots with a semiconducting polymer. Variations are possible, for example constituents A and B may be interchanged between the first and third layers 14 and 18 respectively.

In preferred and useful compositions of material A and material B may include PbS quantum dot nanocrystals, chosen for their ability to absorb light at onset wavelengths tunable from ~800 nm to ~2000 nm[13] for photodetector and photovoltaic applications. The present invention shows herein that a device's photocurrent spectrum corresponds to the nanocrystals' absorption spectrum, indicating that the sensitivity of the nanocomposite could potentially be tuned across the 800 to 2000 nm spectral region.

The selection of the pair material A and material B is important to achieving charge separation between the layers for photodetector and photovoltaic applications for example. Conjugated polymers typically have better hole than electron mobility. Thus, photoconductivity in polymer/nanocrystal composites requires a band alignment that favors transfer of the photogenerated hole to the polymer; that is, the ionization potential of the polymer should, ideally, lie closer to vacuum than that of the nanocrystal. The bulk ionization potential of PbS is ~4.95 eV, while most conjugated polymers have ionization potentials greater than ~5.3 eV[14]. The low ionization potential of PbS relative to other semiconductor materials used in nanocrystal-based photoconductive devices such as the cadmium chalcogenides (bulk ionization potentials between ~6.4 eV and ~7.3 eV) limits the number of readily available conjugated polymers that provide a favorable energy alignment. MEH-PPV was selected for its low ionization potential, variously reported between ~4.9 eV and ~5.1 eV[15, 16]. It was not obvious at the outset that MEH-PPV/PbS would provide the type-II heterojunction needed for efficient photoconduction and for the observation of a photovoltaic effect: the vacuum-referenced band edge of the organic component is uncertain; it is possible that a dipole layer could be formed at the interface between materials, altering the effective band alignment; and the nanocrystal energy levels vary with size. However, MEH-PPV was one available conjugated polymer candidate to provide the correct heterostructure for this application.

Under illumination, an electron-hole pair, or exciton, is formed and the exciton drifts to the interface between the two materials making up the heterostructure; and the electron-hole pair is separated, with the hole remaining on one side of the heterostructure, and the electron now being on the other side of the heterostructure with the electron and hole thus separately diffusing towards their respective electrical contacts.

It will be understood that the layered structure disclosed herein can operate without external bias (a photovoltaic) as well as with external bias (a photodetector). For example, the nanocomposite layered device can be produced using materials wherein the work functions of the materials are such that electrons travel towards one electrode contacting one material, and holes travel to the opposite electrode contacting the other material, resulting in a photovoltaic effect, i.e. the development of a sustained potential difference accompanied by net current flow into an external circuit without the application of an external bias.

Either one of the materials, or both of the materials, may comprise semiconductor quantum dots only, a composite of a polymer and quantum dots, a composite of quantum dots and organic molecules which transport electrons and/or holes, polymers, polymers or organics alone which are semiconducting and absorb in the spectral region of interest.

The two materials would not be made of identical materials, but if they are both made of quantum dots, they could be made of the same semiconducting material but would have different sizes of dots, or they could be made of quantum dots with different semiconducting materials, if one or both materials are made of semiconductor quantum dot nanoparticles alone, then organic materials such as organic ligands may be removed, the example as disclosed in copending U.S. patent application Ser. No. 60/170,944 Filed on Aug. 25, 2005.

Preferred devices produced in accordance with the present invention are comprised of a sandwich structure of glass, indium tin oxide (ITO), poly(p-phenylenevinylene) (PPV) (used as material A), a MEH-PPV/PbS nanocrystal blend (used as material B), and an upper Mg metal electrical contact. In addition to acting as a hole transport layer, the PPV layer provides a number of improvements over samples with the MEH-PPV/nanocrystal layer deposited directly on the ITO: it provides better electrical stability by forming a smooth and pinhole-free pre-layer on which the blend films can be cast, eliminating catastrophic shorts from the upper contact directly through to the ITO; it decreases the dark current by introducing an injection barrier at the ITO contact, allowing larger photocurrent to dark current ratios; and it allows a higher bias to be applied to the samples before electrical breakdown, allowing the establishment of a higher internal field, more efficient photogenerated carrier extraction, and consequently higher photocurrents.

The present invention uses nanotechnology to make solution-processed materials "see in the dark". The material of the present invention can be painted on pre-existing semiconductor substrates and chips, plastic substrates, printed on paper, or made into textiles.

The devices produced herein have utility and numerous applications in producing photovoltaic devices which harvest the significant portion of the sun's spectral power that lies in the short-wavelength infrared. Other applications include the production of electroluminescent sources, photodetectors, and optical modulators. In the case of photodetectors, materials A and B should be one of the following combinations: 1) Polymer-nanocrystal, 2) conductive oxide-nanocrystal, 3) nanocrystal-nanocrystal (two different materials systems).

The present invention will now be illustrated using the following non-limiting examples, which those skilled in the art will appreciate are meant to be exemplary only and in no way are meant to limit the scope of the invention.

EXPERIMENTAL

Materials

The synthesis of oleate-capped PbS nanocrystals followed that used Ref 13. These nanocrystals were then treated with octylamine in a ligand exchange procedure reported elsewhere. After the exchange process, the octylamine-capped nanocrystals were precipitated with N,N-dimethylformamide and redispersed chloroform. The nanocrystal solutions were filtered using a 0.45 μm filter. MEH-PPV was dispersed in chloroform by stirring overnight followed by two hours of ultrasonication and filtration through a 2 μm filter. The nanocrystal and polymer solutions were then mixed to give an 80% weight fraction of nanocrystals relative to MEH-PPV.

Device Fabrication

In a typical procedure, a 170 nm thick polymer/nanocrystal blend film was spin-coated on to a 2.54×2.54 cm$^2$ indium tin oxide (ITO) coated glass slide. Films that were annealed were then heated on a hotplate at the designated temperatures for 1 hour in a N$_2$-filled glove box with <1 ppm residual oxygen and water. Finally, the upper contact (3 mm$^2$) was deposited by vacuum evaporation forming a metal stack of 30 nm Mg/100 nm Ag/5 nm Au.

Characterization Methods

The dark current and photocurrent were measured using an Agilent 4155C Semiconductor Parameter Analyzer and microprobe station. The optical excitation was provided by a 970 nm semiconductor laser working in CW mode with the beam enlarged to a diameter of ~3 mm by a lens. In the measurement of photocurrent spectral response and time response, no bias was applied to the devices and the load resistor. The resistance of the series load resistor was about three orders of magnitude smaller than the resistance of the device under illumination. The potential drop across the load resistor was read by a lock-in amplifier (Model SR803 DSP) for the photocurrent spectral response and by a digital phosphor oscilloscope (Tektronix TDS5104) for the time response. To obtain the photocurrent spectrum, the light from a white light source was dispersed by a monochromater (Triax 320), and mechanically chopped at a frequency of 250 Hz. The light intensity at each wavelength was separately measured so the photocurrent at each wavelength could be scaled to the same incident light intensity by assuming the photocurrent was linearly proportional to the light power in the low intensity region used. Photoluminescence spectra were obtained using a Photon Technologies Inc. spectrofluorometer with a Samples for thermal gravimetric analysis (TGA) were precipitated from chloroform solution, isolated by centrifugation, and dried in vacuum for several hours prior to analysis. TGA was performed using a Cross-sectional TEM samples were prepared as follows: (1) a portion of the coated film was removed from the glass using a razor blade; (2) this film was glued onto a piece of plastic; (3) the plastic, with the sample attached, was microtomed to 70 nm thick species and mounted the species onto the TEM grids.

Methods

Pbs Nanocrystal Synthesis and Ligand Exchange

The synthesis followed that used in Ref. 13. The as-prepared nanocrystals were capped with oleic acid ligands. A post-synthesis ligand exchange was performed to replace these with octylamine ligands. The original oleic acid-capped nanocrystals were precipitated with methanol, dried, and dispersed in an excess of octylamine. This solution was heated at 70° C. for ~16 hours. After heating, the octylamine capped nanocrystals were precipitated with N,N-dimethylformamide and redispersed in chloroform. The nanocrystals were then mixed with MEH-PPV to give a known weight fraction.

Device Processing

A 40 nm poly(p-phenylenevinylene) (PPV) hole transport layer was spin-coated on 2.5×2.5 cm$^2$ indium tin oxide (ITO) coated glass slide and annealed at 200° C. for 3 hours in vacuum to allow polymerization. A MEH-PPV/nanocrystal blend (90% nanocrystal by weight of PbS nanocrystals to MEH-PPV) dissolved in chloroform was spin-coated on the PPV layer to form a film of thickness 100-150 nm. Finally, the upper contact was deposited by vacuum evaporation forming a 3 mm$^2$ metal stack of 150 nm Mg/100 nm Ag/10 nm Au.

The Measurement of Photocurrent Spectral Response

0 V bias was applied to the sample connected in series with a load resistor of ~100Ω, which was about three orders of magnitude smaller than the resistance of the sample. Illumination was provided by a white light source dispersed by a monochromator (Triax 320) and mechanically chopped at a frequency of ~250 Hz. Various filters were used to avoid overtones of the monochromator's grating from illuminating the sample. The potential drop across the load resistor was read by a lock-in amplifier (Model SR803 DSP). The light intensity at each wavelength was separately measured. Then, the photocurrent at each wavelength was scaled to the same incident light intensity by assuming that the photocurrent was linearly proportional to the light intensity in the low intensity region used.

Figure 3B:
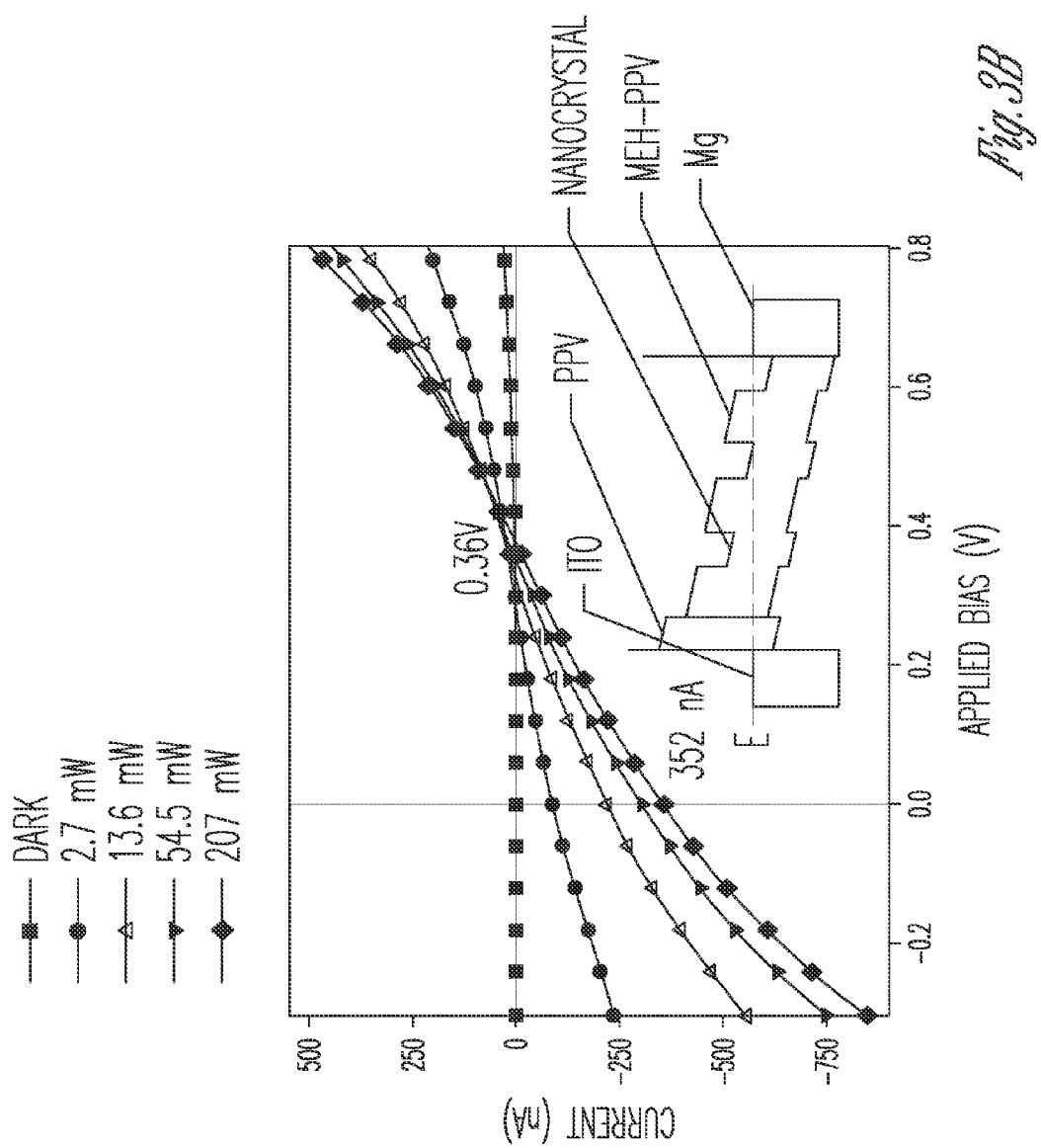
FIG. 3b shows dark current and photocurrent curves in the vicinity of zero bias, of a sample different to the sample of FIG. 3a, demonstrating the photovoltaic effect.

FIGS. 3a and 3b show dark current and photocurrent versus applied bias at the ITO electrode for a nanocomposite photovoltaic device. The pump powers are shown in the figure legends. The data were taken using an Agilent 4155C Semiconductor Parameter Analyzer and microprobe station. The optical excitation was provided by a 975 nm continuous-wave semiconductor laser, which allowed selective excitation of the nanocrystal phase. The main panel shows dark current and photocurrent results for a sample with ~90% by weight nanocrystals in the polymer/nanocrystal blend. The inset shows the dark current for the main panel. The dark current is 216 nA at a bias of 5 V and 144 nA at −5 V Onset FIG. 3a). The photo I-V curves show diode-like behaviour, with higher photocurrents in the reverse bias. The asymmetry of the photocurrent I-V curves can be ascribed to the work function difference between ITO (~4.8 eV) and Mg (3.7 eV) and to the energy levels of the PPV layer. At a bias of −5 V, the photocurrent is 8.43 μA for 2.7 mW incident power and 90.61 μA for 207 mW incident power, which represents a ratio of photocurrent to dark current of 59 and 630, respectively. The above photocurrent under 2.7 mW represents a responsivity of $3.1 \times 10^{-3}$ A/W. When ITO is positively biased at 5 V, the photocurrent is reduced to 5.39 and 28.12 μA for incident powers of 2.7 and 207 mW, respectively.

In FIG. 3b, the main panel shows the dark current and photocurrent curves near zero bias, demonstrating the photovoltaic effect exhibited by this structure. The data for FIG. 3b were obtained from a different sample than shown in FIG. 3a and represent the best results to date for short circuit current and open circuit voltage.

The inset of FIG. 3b shows a possible band diagram for the structure after the Mg contact has been deposited, and the device reaches the equilibrium state. For this diagram, the lowest energy absorption peak is assumed to be the first excitonic absorption of the PbS nanocrystals. This is used to estimate an increase in bandgap energy relative to bulk PbS, which has a bandgap of 0.41 eV; for the nanocrystals with absorption peaks centered at 955, 1200, and 1355 nm depicted in FIG. 3, the effective bandgaps are 1.30, 1.03, and 0.92 eV, respectively. Because of the nearly equal effective masses for holes and electrons in PbS, it is also assumed that the confinement energy is shared equally in the conduction and valence bands so the bands move up and down, respectively, by equal energies. The barrier for electrons comes from the octylamine ligand, which passivates the nanocrystal surface, and/or the MEH-PPV (ionization energy ~4.9 eV and electron affinity ~2.9 eV[15]), which surrounds the nanocrystal.

To align the Fermi level in all layers, the Mg side tilts down and the ITO side tilts up. (Similar band tilting in polymers and in $C_{60}$ doped polymers sandwiched between two different conductors have been discussed by Greczynski et al[17] and Brabec et al[18], respectively). After an electron in the valence band of the nanocrystal is transferred to the conduction band by absorbing a photon, the hole in the valence band may transfer to the hole conducting MEH-PPV, and the electron can either remain in the quantum dot or move through the nanocrystal network by hopping or tunnelling. Depending on the polarity of the built-in and/or applied field, the electron and hole can move towards the ITO or towards the Mg. When the electron moves to the ITO side, it will see a higher barrier by the tilted band and PPV (ionization energy ~5.1 eV and electronic affinity ~2.7 eV[19]) than when moving to the Mg electrode. When the hole moves to the ITO, it also faces a barrier between MEH-PPV and PPV, and no barrier if it moves to the Mg side. Reverse bias results in photogenerated holes being extracted through the ITO/PPV side of the sample, while forward bias results in electrons being extracted through that side. Thus, the higher photocurrent in the reverse bias suggests that the electron barrier posed by the PPV may be more severe than the hole barrier in carrier extraction.

FIG. 3b shows dark and illuminated I-V curves for the region near 0 V, demonstrating the presence of a photovoltaic effect under continuous-wave illumination at 975 nm. The maximum short circuit current is 350 nA for an incident power of 207 mW. The open circuit voltage is 0.36 V. The photovoltaic effect was checked for hysteresis effects to see whether stow charge reorganization alone could be the cause. A sample demonstrating much lower short circuit current (~15 nA) than shown in FIG. 3b was used to provide more convincing evidence that, even with very low short circuit currents, the effect is not simply a hysteretic artefact. The inset of FIG. 2b shows the result of this test where the sample was held at zero bias and the short circuit current monitored over 500 seconds: the signal was stable over this time span. Further evidence that the effect was not hysteresis-based was provided by performing voltage scans in both directions (forward bias to reverse bias and vice versa); the direction of scan had negligible effect on the photovoltaic response. Although this photovoltaic response, which allows separation of an electron-hole pair at zero applied bias, could be indicative of a type-II heterostructure between the PbS nanocrystals and MEH-PPV, the built-in field in the device under zero bias is significant and could also allow charge separation with a marginal type-I heterostructure.

Figure 4A:
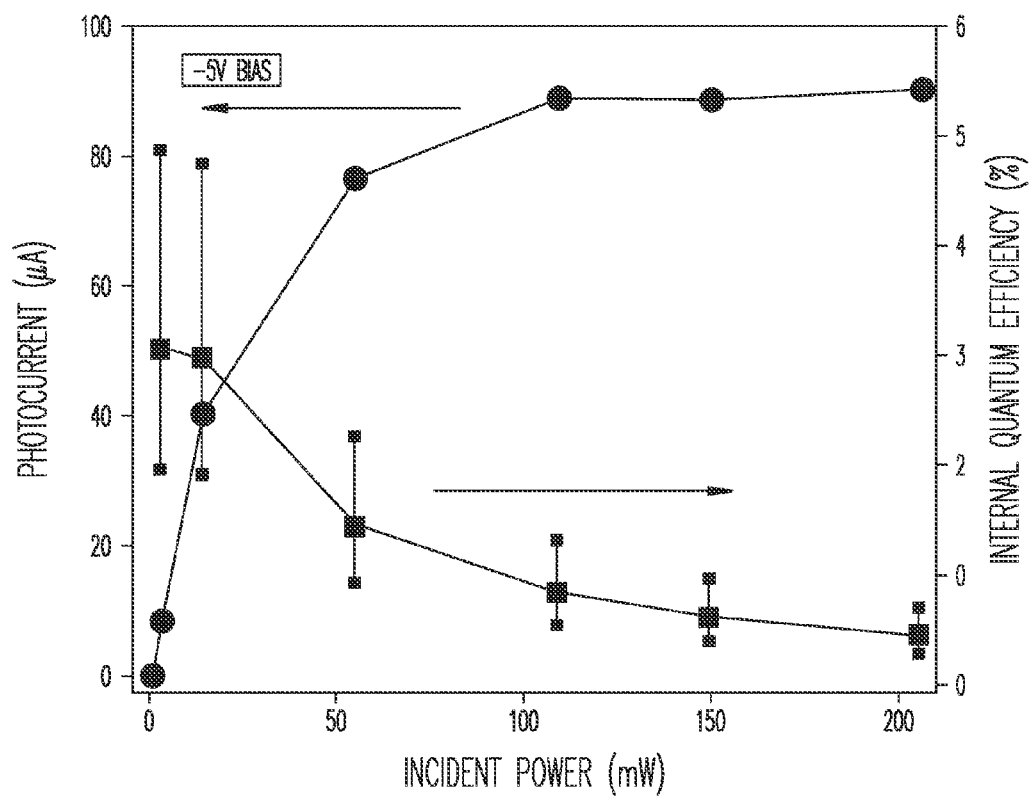
FIG. 4a shows the photocurrent in circles on the left axis and the internal quantum efficiency squares on the right axis are shown as a function of incident power at −5 V bias.

FIG. 4a shows the photocurrent in circles on the left axis and the internal quantum efficiency squares on the right axis are shown as a function of incident power at −5 V bias. The internal quantum efficiency is defined as the ratio of the number of collected charges to the number of absorbed photons at the pump wavelength. The calculation of internal quantum efficiency using absorption values obtained in reflection mode, the handling of optical interference effects, and the range bars on these efficiency values are described in detail in the Methods section. FIG. 4b shows short circuit current (circles) and corresponding internal quantum efficiency (squares) as a function of incident power. The lines are merely provided to guide the eye. Inset: Stability of the short circuit current as a function of time for a sample with much lower photovoltaic response than in FIG. 3b.

The percent absorption at the 975 nm wavelength used to obtain the main efficiency points in FIGS. 4a and 4b was 12.7%; the upper and lower range bars represent upper and lower bounds obtained based on the consideration of multiple pass propagation through the active layer. From the figure it can be seen that the photocurrent does not increase linearly with incident power. Above ~50 mW, the photocurrent increases more slowly with increased power. In the low power region, the recombination of trapped electrons in the nanocrystal network with holes in the neighboring polymer dominates. When more photons are absorbed at higher powers, bimolecular recombination between free holes and electrons occurs in addition to the recombination at electron trap centers[8]. The additional bimolecular recombination reduces the number of photo-excited carriers and, hence, lowers the internal quantum efficiency as shown in FIG. 4a. At an incident power of 2.7 mW the internal quantum efficiency is about 3% (ie. external quantum efficiency of ~0.38%), while at 207 mW the internal quantum efficiency is reduced to about 0.4%. The short circuit current and corresponding internal quantum efficiency is plotted in FIG. 4b, showing a maximum value of ~0.006%) (ie. short circuit external quantum efficiency of ~0.0008%). These zero bias internal quantum efficiencies are about 500 times lower than at −5 V and show similar signs of a roll-off caused by bimolecular recombination at higher powers. The short circuit internal quantum efficiency is much lower than the best reports in the literature for CdSe nanocrystal-based systems where the trioctylphosphine oxide (TOPO) ligands were removed by treatment with pyridine; for samples with the TOPO ligands still present on the nanocrystal surface, these systems showed internal quantum efficiencies closer to, but still slightly higher than, the magnitude reported here[8,20]. Further efforts are required in the PbS system to remove the ligands, potentially markedly improving efficiencies (especially in photovoltaic mode) in system of the present invention.

The 3% internal quantum efficiency at −5 V is a three order-of-magnitude increase over that reported in Ref. 12 and is attributed principally to an improvement in film quality across these large-area devices. The MEH-PPV in previous work was typically cast from toluene and was not ultra-sonicated or filtered. In the present report, the MEH-PPV was cast from chloroform, ultra-sonicated for 1 hour prior to casting the films, and both the polymer and nanocrystal solutions were independently filtered. The combination of the above treatments was shown using atomic force microscopy to provide smoother, more defect-free and pinhole-free films compared to the previous process.

The films produced as in Ref. 12, showed large centers of aggregated material and many pinholes; the newer films show much smaller regions of aggregated, transport-impeding material, and are pinhole-free. The improved surface of the films reported herein allows better interfacial contact with the upper metal electrode resulting in better carrier extraction[21]. Films in the earlier work only contained ~60% nanocrystal by weight because this was the maximum loading that gave films which did not suffer from excessive shorts. In this work, films containing 90% nanocrystal by weight were successfully cast by optimizing the concentration, and hence viscosity, of both the nanocrystal and polymer solutions. The increased nanocrystal loading likely resulted in improved electron transport. Pinholes previously led in Ref 12 to a photocurrent-to-dark-current ratio of ~$10^{-4}$, necessitating the use of lock-in techniques to detect the photocurrent signal. The devices presented herein, with their orders-of-magnitude greater photocurrent-to-dark ratios and efficiencies, were readily studied using continuous-wave methods.

Figure 5:
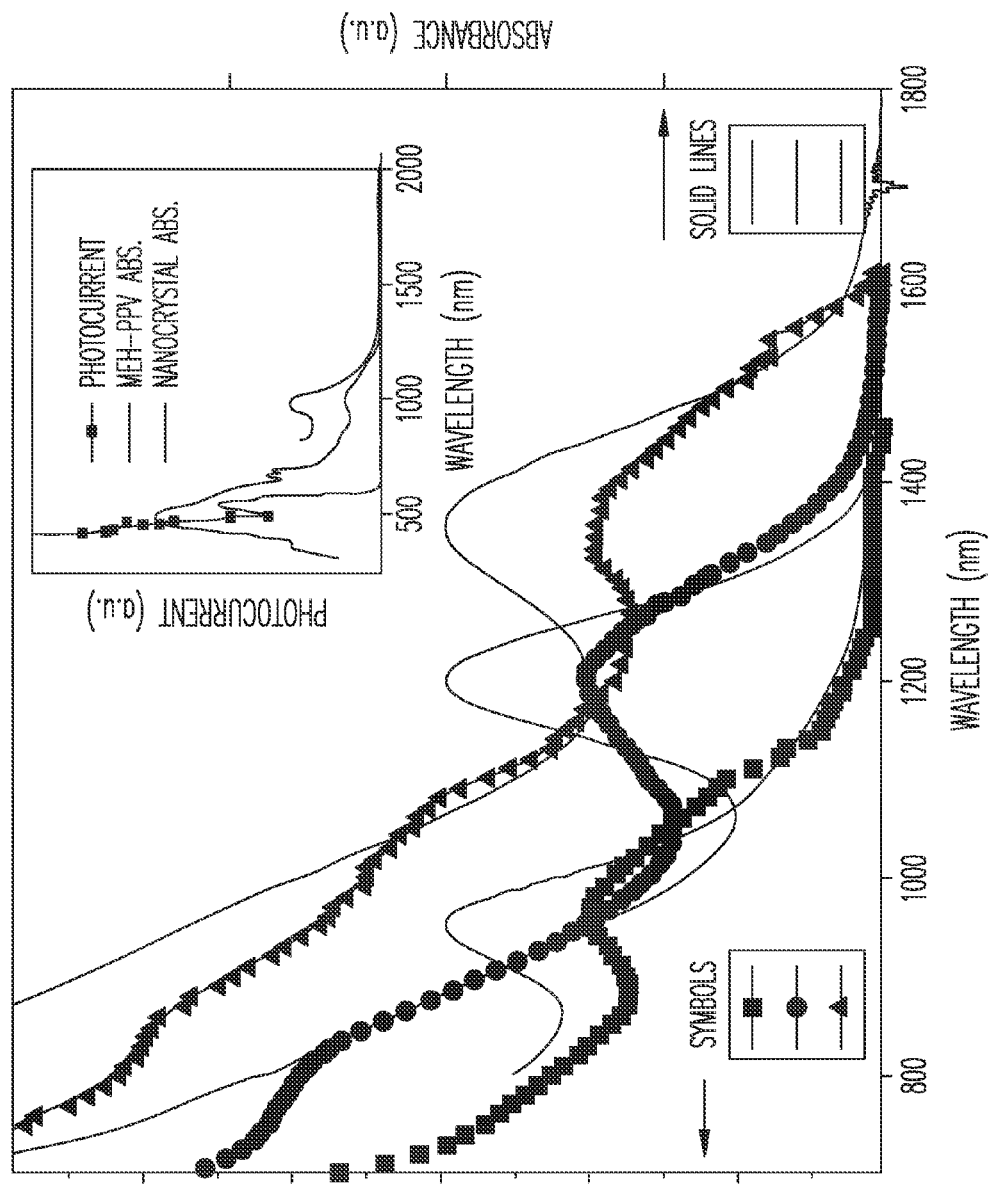
FIG. 5 shows photocurrent spectral responses and absorption spectra. Main Panel: Photocurrent spectral response (symbols) and the corresponding absorption spectra (solid line) for three different samples. The absorption peaks are tuned to 955 (black), 1200 (red), and 1355 nm (blue). Inset: Extended spectral response for the sample centered at 955 nm, indicating the response in the region below ~600 nm where both the polymer and nanocrystal are excited. Also shown are the absorption spectra of the polymer and the nanocrystals.

FIG. 5 shows the absorbance spectrum of the nanocrystals (measured using a Varian CARY 500 Scan Spectrophotometer) used in three different devices, each tuned to a different part of the infrared spectrum, and the measured photocurrent spectral response of each device. No bias was applied to the devices during measurement of the photocurrent spectrum, and the excitation was provided by narrow wavelength bands selected from a white light source by a monochromator. At wavelengths longer than 600 nm, the absorption of MEH-PPV is negligible; thus, all absorption at these wavelengths is assigned solely to the PbS nanocrystals. The absorption peaks at 955, 1200, and 1355 nm correspond to the first excitonic absorption features in the three different choices of PbS nanocrystals. The photocurrent spectra show peaks that match closely the absorption peaks associated with the nanocrystals. Along with demonstrating control over the spectral response, this result adds further evidence that the photocurrent is due to exciton formation in the nanocrystals followed by charge separation. The inset of FIG. 3 shows the spectral response of the device with the 955 nm response peak, including shorter wavelengths where the polymer is also excited. The photocurrent response peaks at a wavelength 60 nm red-shifted relative to the polymer absorption peak.

In summary, large-area-compatible quantum dot infrared photodetectors have been fabricated via solution processing. The active layer is a composite of the conjugated polymer MEH-PPV and PbS nanocrystals. The devices show a maximum photocurrent to dark current ratio of 630 at a bias of −5 V. An internal quantum efficiency at −5 V as high as 3% has been achieved. The devices demonstrate a photovoltaic response under 975 nm continuous-wave excitation where the maximum short circuit current was 350 nA and the open circuit voltage was 0.36 V. The maximum short circuit (photovoltaic) internal quantum efficiency was 0.006%. The spectral response of the photocurrent closely followed the absorption of the nanocrystals and was shown for three different regions of the infrared spectrum. The internal efficiencies, improved from previous work, will benefit from further improvements once refined control over the ligand barrier is obtained.

The nanocomposite layer, one means of making Material A or Material B, can be further improved using the methods described below. These methods resulted in a three-order-of-magnitude improvement in infrared photoconductive internal quantum efficiency compared to, allowing observation of the photocurrent under continuous-wave illumination without reliance on lock-in techniques; and also the first observation of an infrared photovoltaic effect in such materials. Under −5 V bias and illumination from a 975 nm laser, detectors of the present invention show an internal quantum efficiency of 3%, a ratio of photocurrent to dark current of 630, and a maximum responsivity of $3.1 \times 10^{-3}$ A/W. The photovoltaic response under 975 nm excitation results in a maximum open circuit voltage of 0.36 V, short circuit current of 350 nA, and short circuit internal quantum efficiency of 0.006%. The present invention also demonstrates, by varying the size of the nanocrystals during processing, photocurrent spectra with peaks tailored to 980 nm, 1.200 μm, and 1.355 μm.

The present invention took the approach that thermal treatment of the nanocomposite films could result in dramatically enhanced hole transfer from PbS quantum dots to the polymer matrix by increasing the intimacy of contact between the inorganic and polymer phases, potentially via the displacement of some ligands contacting the nanocrystal surfaces, allowing portions of the polymer chains to interact with the nanocrystal surface without the ligand barrier present. A number of reports in the literature have investigated the effects of annealing on polymer-based photovoltaic systems, typically citing changes in film morphology as the cause for improved charge separation or charge mobility.

There are a couple of reports related to the effect of annealing on optoelectronic devices consisting of organic/inorganic nanocrystals. An increase in dark current and photocurrent was observed in TOPO-capped CdSe nanocrystal solids upon thermal annealing. In solar cells consisting of pyridine capped CdSe in P3HT, Huynh et al. reported an increase in external quantum efficiency by a factor of 1.3 to 6, depending on the nanocrystal size, by heating the films. The removal of the ligand, and the reduction in NC separation have been used to explain the observed electrical and optical changes.

The effect of annealing on bilayer or blend photovoltaics is remarkable. However, all of the above studies are related to solar cells working in the visible spectral region. No reports are related to the influence of annealing on photovoltaics made from blends of organic and small band gap inorganic materials, which can be used in the infrared region. The present invention shows herein, that thermal annealing of MEH-PPV/PbS nanocrystal films results in increased dark conductivity and a more rapid photoconductive response, as well as up to a 200-fold improvement in short-circuit current and 600-fold increase in maximum power output. The maximum monochromatic power conversion efficiency achieved upon annealing was 0.001% under 16 mW illumination at 975 nm. The short circuit internal quantum efficiency of annealed samples is about 0.15%, compared to 0.0064% for the best sample reported in Ref. 23. It is of scientific interest to study the role of the ligand and nanocrystal/polymer phase interaction on photovoltaic device performance. It is also of practical importance to achieve higher performance photovoltaic devices by replacing, in the solid state, the high and wide potential barriers for carriers posed by the organic ligand, especially when a ligand with a lower barrier, suitable for solution processing with the polymer, is not available.

Ligand and film morphology control have a significant effect on the performance of PbS nanocrystal/MEH-PPV infrared-sensitive photovoltaic devices. Annealing results in displacement of octylamine ligands from the NC surface, allowing more intimate contact with the MEH-PPV phase, and thus improving the charge separation process. The quenching of the nanocrystal photoluminescence after annealing also suggests rapid exciton dissociation before recombination. Annealing also decreases the separation between isolated domains of nanocrystals within the network, enhancing the electron transport. This causes an increase in dark conductivity, and a relatively more stable and faster temporal response of the photoconductivity in devices made from the annealed samples, suggesting that the charge mobilities are enhanced. The combination of these changes in the ligand and film morphology caused by thermal annealing in a range from about 200° C. to about 250° C., and preferably around 220° C. dramatically improves the performance of the resulting devices, increasing the short circuit current by 200 times and the product of $I_{sc}$ and $V_{oc}$ by 600 times compared to the unannealed devices. A monochromatic power conversion efficiency of 0.001% has been achieved.

Sensitizing conjugated polymers with infrared active nanocrystal quantum dots provides a spectrally tunable means of accessing the infrared while maintaining the advantageous properties of polymers. The present invention uses such a nanocomposite approach in which quantum size effect-tuned PbS nanocrystals sensitize the conjugated polymer poly[2-methoxy-5-(2'-ethylhexyloxy-p-phenylenevinylene)] (MEH-PPV) into the infrared. The present invention achieves, in a solution-processed device and with sensitivity far beyond 800 nm, harvesting of infrared-photogenerated carriers and the demonstration of an infrared photovoltaic effect. The present invention also exploits the wavelength tunability afforded by the nanocrystals to show photocurrent spectra tailored to three different regions of the infrared spectrum.

The present invention generally demonstrate, using solution-processed materials, both a three-order-of-magnitude improvement in infrared photoconductive internal quantum efficiency compared to, allowing observation of the photocurrent under continuous-wave illumination without reliance on lock-in techniques; and also the first observation of an infrared photovoltaic effect in such materials. Under −5 V bias and illumination from a 975 nm laser, detectors of the present invention show an internal quantum efficiency of 3%, a ratio of photocurrent to dark current of 630, and a maximum responsivity of $3.1 \times 10^{-3}$ A/W. The photovoltaic response under 975 nm excitation results in a maximum open circuit voltage of 0.36 V, short circuit 5 current of 350 nA, and short circuit internal quantum efficiency of 0.006%. The present invention also demonstrates, by varying the size of the nanocrystals during processing, photocurrent spectra with peaks tailored to 980 nm, 1.200 μm, and 1.355 μm.

As used herein, the terms "comprises" and "comprising" are to be construed as being inclusive and opened rather than exclusive. Specifically, when used in this specification including the claims, the terms "comprises" and "comprising" and variations thereof mean that the specified features, steps or components are included. The terms are not to be interpreted to exclude the presence of other features, steps or components.

It will be appreciated that the above description related to the invention by way of example only. Many variations on the invention will be obvious to those skilled in the art and such obvious variations are within the scope of the invention as described herein whether or not expressly described.

REFERENCES

1. Forrest, S. R. The path to ubiquitous and low-cost organic electronic appliances on plastic. Nature 428, 911-918 (2004).
2. Brabec, C. J. et al. A low-bandgap semiconducting polymer for photovoltaic devices and infrared diodes. Adv. Funct. Mater. 12, 709-712 (2002).
3. Yoshino, K. et al. Near IR and UV enhanced photoresponse of $C_{60}$-doped semiconducting polymer photodiode. Adv. Mater. 11, 1382-1385 (1999).
4. Huynh, W. U., Dittmer, J. J. & Alivisatos, A. P. Hybrid nanorod-polymer solar cells. Science 295, 2425-2427 (2002).
5. Wang, Y. & Herron, N. Photoconductivity of CdS nanocluster-doped polymers. Chem. Phys. Lett. 200, 71-75 (1992).
6. Dabbousi, B. O., Bawendi, M. G., Onitsuka, O. & Rubner, M. F. Electroluminescence from CdSe quantum-dot/polymer composites. Appl. Phys. Lett. 66, 1316-1318 (1995).
7. Mattoussi, H. et al. Electroluminescence from heterostructures of poly(phenylene vinylene) and inorganic CdSe nanocrystals J. Appl. Phys. 83, 7965-7947 (1998).
8. Greenham, N. C., Peng, X. & Alivisatos, A. P. Charge separation and transport in conjugated-polymer/semiconductor-nanocrystal composites studied by photoluminescence quenching and photoconductivity. Phys. Rev. B 54, 17628-17637 (1996).
9. Bakueva, L. et al. Size-tunable infrared (1000-1600 nm) electroluminescence from PbS quantum-dot nanocrystals in a semiconducting polymer. Appl. Phys. Lett. 82, 2895-2897 (2003).
10. Tessler, N., Medvedev, V., Kazes, M., Kan, S. K. Banin, U. Efficient near-infrared polymer nanocrystal light-emitting diodes. Science 295, 1506-1508 (2002).
11. Steckel, J. S., Coe-Sullivan, S., Bulovic, V. & Bawendi, M. 1.3 μm to 1.55 μm tunable electroluminescence from PbSe quantum dots embedded within an organic device. Adv. Mater. 15, 1862-1866 (2003).
12. McDonald, S. A., Cyr, P. W., Levina, L. & Sargent, E. H. Photoconductivity from PbS-nanocrystal/semiconducting polymer composites for solution-processible, quantum-size tunable infrared photodetectors. Appl. Phys. Lett. 85, 2089-2091 (2004).
13. Hines, M. A. & Scholes, G. D. Colloidal PbS nanocrystals with size-tunable near-infrared emission: observation of post-synthesis self-narrowing of the particle size distribution. Adv. Mater. 15, 1844-1849 (2003).
14. Skotheim, T. A. (ed.) Handbook of Conducting Polymers. (Dekker, New York, USA, 1986).
15. Greenwald, Y. et al. Polymer-polymer rectifying heterojunction based on poly(3,4-dicyanothiophene) and MEH-PPV. J. Polym. Sci. A: Polym. Chem. 36, 3115-3120 (1998).
16. Jin, S-H. et al. Synthesis and characterization of highly luminescent asymmetric poly(p-phenylene vinylene) derivatives for light-emitting diodes. Chem. Mater. 14, 643-650 (2002).
17. Greczynski, G., Kugler, Th. & Salaneck, W. R Energy level alignment in organic-based three-layer structures studied by photoelectron spectroscopy. J. Appl. Phys. 88, 7187-7191 (2000).
18. Brabec, C. J. et al. Origin of the open circuit voltage of plastic solar cells. Adv. Funct. Mater. 11, 374-380 (2001).
19. Schlamp, M. C., Peng, X. & Alivisatos, A. P. Improved efficiencies in light emitting diodes made with CdSe (CdS) core/shell type nanocrystals and a semiconducting polymer. J. Appl. Phys. 82, 5837-5842 (1997).
20. Ginger, D. S. & Greenham, N. C. Charge injection and transport in films of CdSe nanocrystals. J. Appl. Phys. 87, 1361-1368 (2000).
21. Nguyen, T-Q., Kwong, R C., Thompson, M. E. & Schwartz, B. J. Improving the performance of conjugated polymer-based devices by control of interchain interactions and polymer film morphology. Appl. Phys. Lett. 76, 2454-2456 (2000).
22. Peumans, P., Yakimov, A. & Forrest, S. R. Small molecular weight organic thin-film photodetectors and solar cells. J. Appl. Phys. 93, 3693-3723 (2003).
23. S. A. McDonald, G. Konstantatos, S. Zhang, P. W. Cyr, E. J. D. Klem, L. Levina, E. H. Sargent, *Nature Materials*. 2004 in press.
24. M. Drees, J. R Heflin, R. M. Davis, D. Topasna and P. Stevenson, "Enhanced photovoltaic efficiency in polymer-fullerene composites by thermally controlled interfiffusion", in Proceedings of SPIE (held on Aug. 7-8, 2003 at San Diego, Calif., USA), ed. Z. H. Kafafi and P. A Lane, vol 5215 (2004) p 89
25. B. Kippelen, S. Yoo, B. Domercq, C. L. Donley, C. Carter, W. Xia, B. A Minch, D. F. O'Brien, N. R. Armstrong, "Organic Photovoltaics based on self-assembled mesophases" NCPV and solar Program Review Meeting, 2003, NREL/CD-520-33586, p 431
26. A. J. Breeze, G. Rumbles, B. A Gregg abd D. S. Ginley, "The effects of processing conditions on polymer photovoltaic device performance", in Proceedings of SPIE (held on Aug. 7-8, 2003 at San Diego, Calif., USA), ed. Z. H. Kafafi and P. A Lane, vol 5215 (2004) p 271
27. M. M. Koetse, J. Sweelseen, T. Franse, S. C. Veenstra, J. M. Kroon, X. Yang, A. Alexeev J. Loos, U. S. Schubert, H. F. M. Schoo, "The influence of the polymer architecture on morphology and device properties of polymer bulk heterojunction photovoltaic cells", in Proceedings of SPIE (held on Aug. 7-8, 2003 at San Diego, Calif., ed. Z. H. Kafafi and P. A Lane, vol 5215 (2004) p 119
28. A. Henckens, M. Knipper, I. Polec, J. Manca, L. Lutsen, D. Vanderzande, *Thin Sol. Films.* 2004, 572, 451.
29. F. Wei, Y. L. Xu, W. H, Yi, F. Zhou, X. G. Wang, Y. Katsumi, *Chinese Physics,* 2003, 12, 426,
30. M. Drndic, M. V. Jarosz, N. Y. Morgan, M. K. Kastner, M. G. Bawendi, J. *Appl. Phys.* 2002, 92, 7498.
31. W. U. Huynh, J. J. Dittmer, W. C. Libby, G. L. Whiting, A P. Alivisatos, *Adv. Funct. Mater.* 2003, 13, 73.
32. T. Q. Nguyen, L B. Martini, J. Liu, B. J. Schwartz, *J. Phys. Chem. B.* 2000, 104, 237.
33. T-W, Lee, O. O. Park, L-M. Do, T. Zyung, *Molec. Cryst. And Liq. Cryst.* 2000, 349, 451.
34. V. I. Kilimov, Semiconductor and Metal Nanocrystals: Synthesis and Electronic and Optical Properties, Marcel Dekker, Inc. New York, 2004, ch. 5
35. A. Gadisa, M. Svensson, R. Anderson, O. Inganas, *Appl. Phys. Lett.* 2004, 84, 1609.

What is claimed is:

1. A method of producing a light-sensing system on a semiconductor substrate having at least one integrated circuit device defined thereon, the method comprising:
   forming a nanomaterial having at least one semiconductor quantum dot over the integrated circuit device; and
   forming a three-dimensional bicontinuous heterostructure including at least two materials, with a first material formed on the semiconductor substrate and a second material located on the first material, the first material and the second material each having a structure that includes protrusions with substantially no islands, the protrusions from the first material penetrate into the second material forming an irregular interpenetrating interface between the first material and the second material.

* * * * *